(12) United States Patent
Aratake

(10) Patent No.: US 7,553,609 B2
(45) Date of Patent: Jun. 30, 2009

(54) MANUFACTURING METHOD OF PIEZOELECTRIC VIBRATING PIECE, PIEZOELECTRIC VIBRATING PIECE, PIEZOELECTRIC VIBRATOR, OSCILLATOR, ELECTRONIC EQUIPMENT AND RADIO-CONTROLLED TIMEPIECE

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 400 days.

(21) Appl. No.: 11/605,165

(22) Filed: Nov. 28, 2006

(65) Prior Publication Data

US 2007/0159029 A1 Jul. 12, 2007

(30) Foreign Application Priority Data

Nov. 30, 2005 (JP) .............................. 2005-346399

(51) Int. Cl.
*H03H 3/02* (2006.01)
(52) U.S. Cl. ........................ 430/318; 430/319; 430/320; 430/396
(58) Field of Classification Search ........................ None
See application file for complete search history.

(56) References Cited

U.S. PATENT DOCUMENTS

2003/0071542 A1* 4/2003 Satoh et al. .................. 310/367
2005/0006988 A1* 1/2005 Kawauchi et al. ........... 310/367
2005/0115038 A1* 6/2005 Umetsu et al. .............. 29/25.35
2006/0130579 A1* 6/2006 Dalla Piazza et al. ..... 73/504.16

FOREIGN PATENT DOCUMENTS

WO WO 00/44092 7/2000

\* cited by examiner

*Primary Examiner*—John A. McPherson
(74) *Attorney, Agent, or Firm*—Brinks Hofer Gilson & Lione

(57) ABSTRACT

There are provided a piezoelectric vibrating piece, which has been more miniaturized and whose efficiency has been more increased, by easily and certainly electrode-dividing an exciting electrode, and a manufacturing method of the same. There is provided a manufacturing method of a piezoelectric vibrating piece, characterized by having an exposure process in which a mask having an opening part is disposed such that the opening part is located on at least either edge of a 1st edge, in two places, formed by a main face and a side face of a vibrating arm part or a 2nd edge, in two places, formed by the main face and a side face of a groove part, and a parallel light is slantingly irradiated through the opening part toward at least either of a bottom face or an outside of the groove part while following a face intersecting perpendicularly to a longitudinal direction of the vibrating arm part to thereby expose a photosensitive film.

4 Claims, 13 Drawing Sheets

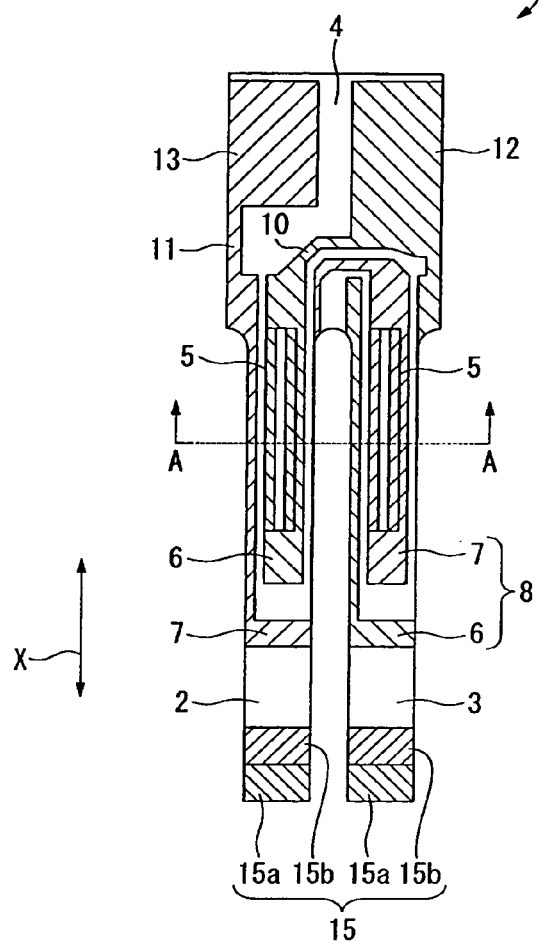
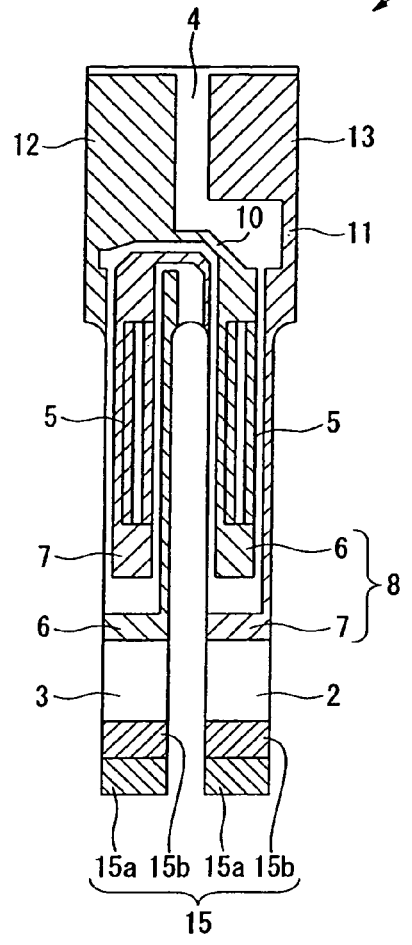
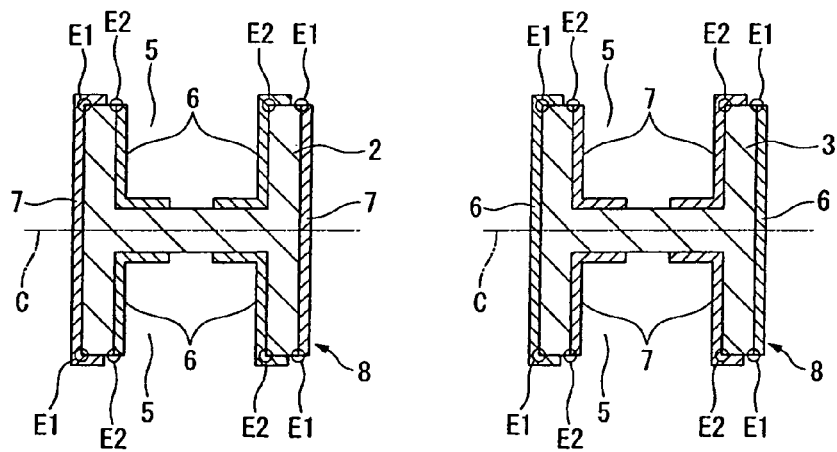

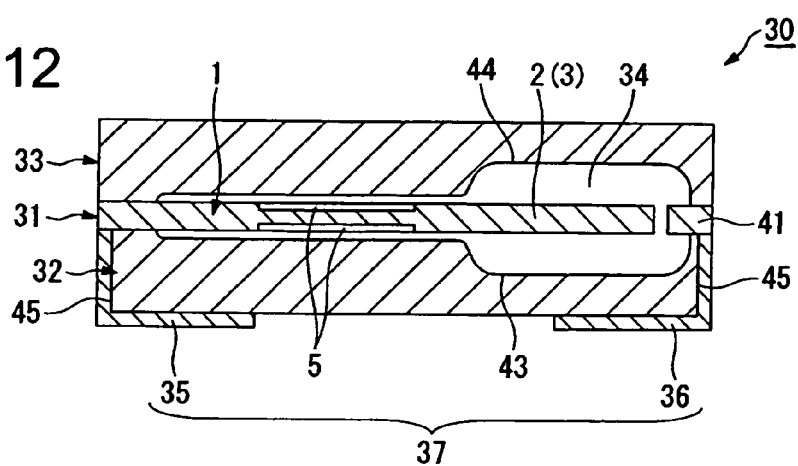
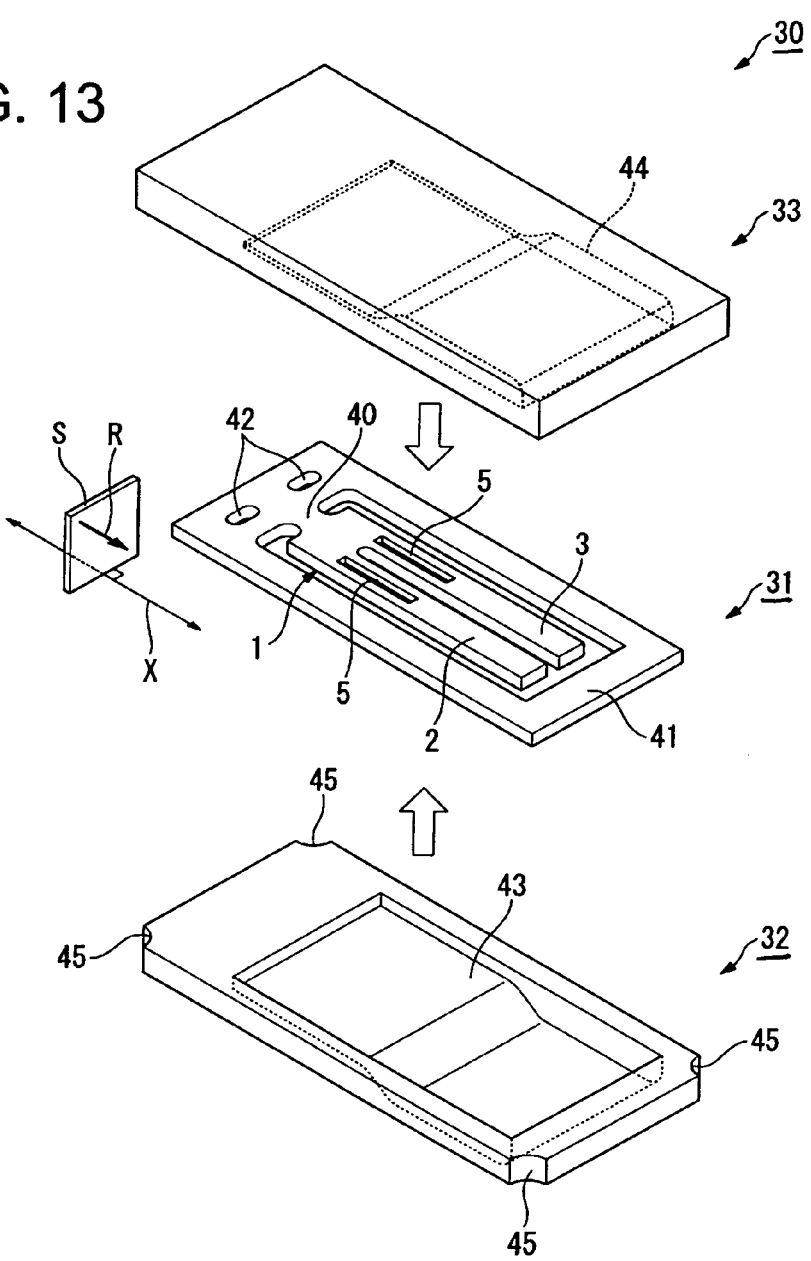

MANUFACTURING METHOD OF PIEZOELECTRIC VIBRATING PIECE, PIEZOELECTRIC VIBRATING PIECE, PIEZOELECTRIC VIBRATOR, OSCILLATOR, ELECTRONIC EQUIPMENT AND RADIO-CONTROLLED TIMEPIECE

This application claims priority under 35 U.S.C. §119 to Japanese Patent Application No. JP2005-346399 filed Nov. 30, 2005, the entire content of which is hereby incorporated by reference.

BACKGROUND OF THE INVENTION

1. Field of the Invention

The present invention relates to a manufacturing method of a piezoelectric vibrating piece, the piezoelectric vibrating piece, a piezoelectric vibrator, an oscillator, an electronic equipment and a radio-controlled timepiece.

2. Description of the Related Arts

In recent years, in a portable telephone and a portable information terminal equipment, there is used the piezoelectric vibrator utilizing a quartz crystal or the like as a time instant source, a timing source of a control signal, a reference signal source, and the like. As to this kind of piezoelectric vibrator, although various ones are provided, as one of them there is known a surface mount type piezoelectric vibrator constituted by a piezoelectric vibrator plate in which the piezoelectric vibrating piece has been formed by being surrounded by a frame-like part, and a lid member and a base member, which have been anode-bonded above and below so as to nip the piezoelectric vibrator plate between them.

Especially, in recent years, there is provided a grooved piezoelectric vibrator whose equivalent resistance value has been suppressed to a lower value (See, e.g., WO 00/44092).

This piezoelectric vibrator possesses a piezoelectric vibrator plate comprising a piezoelectric vibrating piece, which consists of two vibrating arm parts extending parallel, and a frame-like part fixing a base end side of the piezoelectric vibrating piece, and groove parts along a longitudinal direction of the vibrating arm parts are formed respectively in base end side upper/lower faces of the two vibrating arm parts.

Concretely, there is explained while referring to FIG. 21 to FIG. 23. FIG. 21 is a sectional view of one pair of vibrating arm parts having a conventional groove part. FIG. 22 is a process view in a case where an exciting electrode is formed on the vibrating arm part shown in FIG. 21, and a view showing a state in which a photoresist film having been coated around the vibrating arm part is being exposed by irradiating a parallel light from just above through an opening part of a mask. FIG. 23 is a process view in a case where the exciting electrode is formed on the vibrating arm part shown in FIG. 21, and a view showing a state in which the photoresist film having been exposed in FIG. 22 has been developed.

As shown in FIG. 21, the base end sides of two vibrating arm parts 120 are formed so as to become respectively an H type in section by a groove part 121. And, in a surface of each vibrating arm part 120, there are formed exciting electrodes 122, 123 whose polarities differ, and the two vibrating arm parts 120 are vibrated (bend-vibrated) in a predetermined period so as to mutually approach or separate.

Especially, in a case where the groove part 121 is formed in the vibrating arm part 120, since the two exciting electrodes 122, 123, which have been formed in regions on a side face of the vibrating arm part 120 and a side face of the groove part 121, become an opposed positional relation, an electric field is liable to act more efficiently in comparison with a case where the groove part 121 is not formed. For this reason, as mentioned above, a vibration loss is low and it is possible to suppress the equivalent resistance value as low as possible, so that there is suitably used for the piezoelectric vibrator in which a high efficiency performance is demanded.

Incidentally, the exciting electrode 122 (123) having been formed in a region on a bottom face of the groove part 121 does not become a positional relation opposed to the other exciting electrode 123 (122) having been formed in a region on a side face of the vibrating arm part 120, it is difficult to effect on the electric field, so that it does not become an electrode of such a degree as to effect on a characteristic.

Here, there is explained about formation processes of the two exciting electrodes 122, 123.

First, as shown in FIG. 22, to a whole surface of the vibrating arm part 120, there is coated a metal film 124 of chromium, aluminum or the like, which becomes the exciting electrodes 122, 123 later, and a positive type photoresist 125 for instance is coated on the metal film 124 by a spray coat and the like. Subsequently, a photomask 127 in which an opening part 126 of a predetermined size has been formed is located on the photoresist film 125. On this occasion, the photomask 127 is precisely positioned such that the opening parts 126 are located respectively on the vibrating arm parts 120 having nipped the groove part 121. Subsequently, a parallel light R is irradiated from above toward straightly just below, and the photoresist 125 is exposed through the opening part 126. On this occasion, the photoresist film 125 becomes a state having been exposed only in a region in which the opening part 126 has been formed.

Subsequently, after the photomask 127 has been removed, a development of the photoresist film 125 is performed. By this, since the photoresist film 125 is the positive type, it becomes a state in which only the region having been exposed has been removed as shown in FIG. 23. And, by etching-working the metal film 124 with this photoresist film 125 being made a mask and thereafter removing the photoresist film 125, the two exciting electrodes 122 and 123 whose polarities differ can be formed on an outer surface of the vibrating arm part 120 as shown in FIG. 21.

However, in the above conventional method, following problems are left.

That is, in order to cope with a miniaturization and an increase in efficiency of the recent electronic equipment or the like, an additional miniaturization and an additional increase in efficiency are demanded also for a grooved piezoelectric vibrator itself. In order to cope with this, it is considered to thin as much as possible a width W1 of each of left-and-right side walls nipping the groove part 121 as shown in FIG. 21. By doing so, it is possible to shorten a distance between the opposed two exciting electrodes 122, 123, and an electric field efficiency can be improved. Therefore, the additional miniaturization and the additional increase in efficiency can be intended, so that it is possible to respond to the above-mentioned needs.

However, the more the width W1 of the side wall is thinned, there arises a problem that it becomes difficult to divide the metal film 124 by the above-mentioned exposure process and development process to thereby electrically cut off the two electrodes 122, 123 respectively. That is, this is because, since it is impossible to narrow a division electrode width W2 (e.g., 10 μm) more than this in order to electrically, certainly cut off the two exciting electrodes 122, 123, if the width W1 of the side wall is thinned, a region for forming the division electrode width W2 becomes gradually null. For this reason, in a case where the width W1 of the side wall has become narrow, it is technically difficult to expose the photoresist film 125 such that the division electrode width W2 is certainly ensured, so that it has been impossible to form the two exciting electrodes 122, 123 under the state having been electrically, certainly cut off on the vibrating arm parts 120 having nipped the groove part 121. As a result, it has been difficult to respond to the above-mentioned needs.

SUMMARY OF THE INVENTION

The present invention is one having been made in view of such circumstances, and its object is to provide a piezoelectric vibrating piece, which has been more miniaturized and whose efficiency has been more increased, by easily and certainly electrode-dividing an exciting electrode and a manufacturing method of the same, a piezoelectric vibrator and an oscillator, which have the piezoelectric vibrating piece, and additionally an electronic equipment and a radio-controlled timepiece, which have the piezoelectric vibrator.

In order to solve the above problems, the present invention provides the following means.

The present invention is a method of manufacturing a piezoelectric vibrating piece having one pair of vibrating arm parts having been disposed parallel by using a photolithography technique to a piezoelectric plate consisting of a piezoelectric material, a base part integrally fixing base end sides of the one pair of vibrating arm parts, groove parts having been formed respectively in both main faces of the one pair of vibrating arm parts along a longitudinal direction of the vibrating arm part, and an exciting electrode which is formed on outer surfaces of the one pair of vibrating arm parts and which vibrates the one pair of vibrating arm parts, characterized in that an electrode formation process for forming the exciting electrode has a coating process for coating an electrically conductive film to whole outer surfaces of the one pair of vibrating arm parts, an application process for applying a photosensitive film consisting of a positive type photosensitive material onto the electrically conductive film, an exposure process in which a mask having an opening part having been previously patterned is disposed such that the opening part is located on at least either edge of a 1st edge, in two places, formed by the main face and a side face of the vibrating arm part or a 2nd edge, in two places, formed by the main face and a side face of the groove part, and a parallel light is slantingly irradiated through the opening part toward at least either of a bottom face or an outside of the groove part while following a face intersecting perpendicularly to a longitudinal direction of the vibrating arm part to thereby expose the photosensitive film, a development process for developing the photosensitive film to thereby remove an exposed region, and an etching process for etching-working the electrically conductive film with the residual photosensitive film being made a mask, thereby forming the exciting electrode.

In the manufacturing method of the piezoelectric vibrating piece concerned with this invention, first, the one pair of vibrating arm parts and the base part are integrally formed by using the lithography technique to the piezoelectric plate and, after there has been performed a formation process for forming the groove part in each of the one pair of vibrating arm parts, the piezoelectric vibrating piece is manufactured by performing the electrode formation process for forming the exciting electrode.

Especially, when performing the electrode formation process, first, there is performed the coating process for coating the electrically conductive film, such as aluminum film, to whole outer surfaces of the one pair of vibrating arm parts. On this occasion, there becomes a state in which the electrically conductive film has been coated also on the groove part.

Subsequently, there is performed the application process for applying the photosensitive film (e.g., photoresist film) consisting of a positive type photosensitive material onto the electrically conductive film by a spray coat or the like.

Subsequently, the mask having the opening part to which a predetermined patterning has been previously performed is disposed such that the opening part is located on at least either edge of the 1st edge, in two places, formed by the main face of the vibrating arm part and the side face of the vibrating arm part or the 2nd edge, in two places, formed by the main face of the vibrating arm part and the side face of the groove part.

And, there is performed the exposure process in which the parallel light is slantingly irradiated from above through the opening part toward at least either of the bottom face or the outside of the groove part while following the face intersecting perpendicularly to the longitudinal direction of the vibrating arm part to thereby expose the photosensitive film.

In other words, in a case where the mask has been installed such that the opening part is located on the 1st edge, the parallel light is slantingly irradiated through the opening part such that the light passes outward of the vibrating arm part while following the face intersecting perpendicularly to the longitudinal direction. Further, in a case where the mask has been installed such that the opening part is located on the 2nd edge, the parallel light is slantingly irradiated through the opening part toward the bottom face of the groove part while following the face intersecting perpendicularly to the longitudinal direction. In any case, there becomes a state in which, within the photosensitive film having been formed on both main faces of the vibrating arm parts nipping the groove part, one portion located on the edge has been exposed by being irradiated by the parallel light having entered through the opening part.

Especially, since the parallel light is slantingly irradiated in the above-mentioned direction, even if the opening part of the mask exists on any edge, since the photosensitive film having been applied onto the side face of the vibrating arm part or the photosensitive film having been applied onto the side face of the groove part becomes a state having entered into a shade, the parallel light is not irradiated, so that it is not exposed.

Incidentally, in a case where the opening part has been located on the edge in a side face of the groove part, i.e., on the 2nd edge, there becomes a state in which one part of the photosensitive film having been coated on the bottom face of the groove part has been exposed. About this, there is explained later.

After the above exposure process has finished, there is performed the development process for developing the photosensitive film to thereby remove the exposed region. By this, the photosensitive film becomes a state in which an opening has been formed in a portion to which the parallel light has been irradiated. And, there is performed the etching process for etching-working the electrically conductive film with the residual photosensitive film being made the mask. By this, the electrically conductive film is shaved in its region abutting on the opening portion of the photosensitive film, thereby being divided physically and electrically. As a result, it is possible to form the exciting electrode on the outer surface of the vibrating arm part under a patterned state.

Especially, on an occasion of the exposure process, by slantingly irradiating the parallel light, since only one portion located on the edge within the photosensitive film having been applied onto both main faces of the vibrating arm part is exposed without exposing the photosensitive film having been applied to the side face of the vibrating arm part and the side face of the groove part, it is possible to form only one exiting electrode on both main faces of the vibrating arm parts having nipped the groove part between them under a state electrically cut off from the other exciting electrode while forming the exciting electrode on the side face of the vibrating arm part and the side face of the groove part.

Here, hitherto, since the parallel light has been irradiated from above the one pair of vibrating arm parts nipping the groove part to just below, it has been obliged to expose the photosensitive film located in an approximately intermediate portion on both main faces in order that the light does not impinge against the photosensitive film on the side face of the vibrating arm part or the side face of the groove part. As a result, when a whole size has been made small, a problem of a divided electrode width (W2 shown in FIG. 18) has occurred.

In contrast to this, according to the present invention, by slantingly irradiating the parallel light, since it is possible to form only one exiting electrode on both main faces of the vibrating arm parts having nipped the groove part between them under the state electrically cut off from the other exciting electrode while forming the exciting electrode on the side face of the vibrating arm part and the side face of the groove part, even if the whole size has been made small, the conventional problem of the divided electrode width becomes null, so that it is possible to easily and certainly perform the electrode division.

In other words, since only one exciting electrode can be formed on both main faces of the vibrating arm parts nipping the groove part between them, even if the whole size has been made small, it is unnecessary to worry about a contact between the exciting electrodes, so that it is possible to concentratedly form only either exciting electrode with a surplus in a line width. As a result, it is possible to intend the additional miniaturization and the additional increase in efficiency by an improvement in energy efficiency, so that a reliability can be improved.

Incidentally, even if one portion of the exciting electrode on the bottom face of the groove part has become null by the fact that the photosensitive film having been applied onto the bottom face of the groove part is exposed, there arises no problem. This is because the exciting electrodes contributing to the vibration of the vibrating arm part are electrodes which are formed respectively on the side face of the vibrating arm part and the side face of the groove part, which are in a mutually opposing positional relation, and whose polarities differ, and an electric field is formed by these. Since the exciting electrodes on the groove part bottom face of front and back main faces in the same vibrating arm part are mutually the same polarity, no electric field occurs.

Further, hitherto, since the exciting electrode is formed on both main faces of one pair of vibrating arm parts nipping the groove part, it has been necessary to highly, accurately dispose the opening part of the mask in a predetermined position. However, according to the present invention, since only one exciting electrode is formed, it is unnecessary to highly, accurately dispose the mask. For this reason, the manufacture becomes easy, and it is possible to intend to shorten a manufacturing time.

Further, a manufacturing method of a piezoelectric vibrating piece of the present invention is one characterized in that, in the above manufacturing method of a piezoelectric vibrating piece of the present invention, on an occasion of the exposure process, the mask is disposed such that the opening parts are located respectively on the 1st edge in one place and on the 2nd edge, in one place, which is in a positional relation nipping the groove part between it and the 1st edge, and the photosensitive film is exposed in two places at the same time through the opening parts.

Further, a piezoelectric vibrating piece of the present invention is one which possesses one pair of vibrating arm parts having been disposed parallel, a base part integrally fixing base end sides of the one pair of vibrating arm parts, groove parts having been formed respectively on both main faces of the one pair of vibrating arm parts along a longitudinal direction of the vibrating arm part, and an exciting electrode which is formed on outer surfaces of the one pair of vibrating arm parts and which vibrates the one pair of vibrating arm parts, and which is characterized in that with respect to each of the one pair of vibrating arm parts, the exciting electrode is respectively, electrically cut off between a 1st edge, in two places, formed by the main face and a side face of the vibrating arm part and a 2nd edge, in two places, formed by the main face and a side face of the groove part on the 1st edge in one place and on the 2nd edge, in one place, which is in a positional relation nipping the groove part between it and the 1st edge.

In the manufacturing method of the piezoelectric vibrating piece and the piezoelectric vibrating piece concerned with this invention, on an occasion of the exposure process, the mask is disposed such that the opening parts are located respectively on the 1st edge in one place and on the 2nd edge, in one place, which is in the positional relation nipping the groove part between it and the 1st edge. And the photosensitive film is exposed in two places at the same time through the opening parts by slantingly irradiating the parallel light. Especially, since the mask is disposed such that the opening parts are respectively located on the 1st edge and the 2nd edge, which are in the positional relation nipping the groove part between them, the parallel light having passed through the opening parts is respectively irradiated toward the bottom face and the outside of the groove part. Accordingly, by the irradiation of the parallel light in one time, it is possible to perform the exposure in two places at one time without exposing the photosensitive film on the side face of the vibrating arm part and the side face of the groove part. Therefore, it is possible to shorten the manufacturing time, and it is possible to improve a manufacturing efficiency.

Further, a manufacturing method of a piezoelectric vibrating piece of the present invention is one characterized in that, in the above manufacturing method of a piezoelectric vibrating piece of the present invention, when the parallel light is irradiated toward a bottom face of the groove part in the exposure process, an incident angle of the parallel light and a position of the opening part are adjusted such that a plane region or a deepest part of the photosensitive film having been formed on the bottom face of the groove part is irradiated.

In the manufacturing method of a piezoelectric vibrating piece of this invention, the mask is disposed such that the opening part is located on the 1st edge formed by the main face of the vibrating arm part and the side edge of the groove part and, when the parallel light has been slantingly irradiated toward the bottom face of the groove part, a whole region of the photosensitive film on the bottom face is not exposed, but only the plane region or the deepest part is exposed.

Here, in a case where, by a relation between a width and a depth of the groove part, the bottom face of the groove part is not completely a plane and one portion becomes a slant face state, since the exciting electrode formed on the slant face portion becomes a positional relation slightly opposing to the exciting electrode formed on the side face of the vibrating arm part, it becomes an exciting electrode liable to contribute to the vibration of the vibrating arm part. Therefore, by exposing only the photosensitive film of the plane region or the deepest part as mentioned above, it is possible to leave as much as possible the exciting electrode contributing to this vibration. For this reason, an additional increase in efficiency can be intended.

Further, a manufacturing method of a piezoelectric vibrating piece of the present invention is one characterized in that, in the above manufacturing method of a piezoelectric vibrating piece of the present invention, on an occasion of the exposure process, by relatively changing a direction of the one pair of vibrating arm parts with respect to an irradiation direction of the parallel light, the parallel light is irradiated under a state that a predetermined angle has been formed with respect to the face intersecting perpendicularly to the longitudinal direction.

In the manufacturing method of a piezoelectric vibrating piece of this invention, on the occasion of the exposure process, since the parallel light is irradiated under the state that the predetermined angle has been formed with respect to the face intersecting perpendicularly to the longitudinal direction, in addition to the exposure of the photosensitive film having been applied onto the main face of the vibrating arm parts nipping the groove part, besides, it is possible to expose a region requiring the exposure at a suitable time. For example, it is possible to expose the photosensitive film having been formed on a side face portion (portion parallel to the face intersecting perpendicularly to the longitudinal direction) of the base end side having been nipped by one pair of vibrating arm parts. By this, it is possible to form the patterned exciting electrode by more freely performing the division of the electrically conductive film. Therefore, it is possible to improve a degree of freedom in a design.

Further, a piezoelectric vibrator of the present invention is one characterized by having the above piezoelectric vibrating piece of the present invention.

In the piezoelectric vibrator concerned with this invention, since it has the piezoelectric vibrating piece which has been more miniaturized and whose efficiency has been more increased, similarly it is possible to intend the miniaturization and the increase in efficiency, and it is possible to improve a reliability of a product itself. As such a piezoelectric vibrator, there is, e.g., a cylinder package type piezoelectric vibrator, a box shape ceramic package type piezoelectric vibrator, or the like.

Further, a piezoelectric vibrator of the present invention is one characterized by possessing a piezoelectric vibrator plate which is integrally connected to the base part of the above piezoelectric vibrating piece of the present invention, and has a frame-like part surrounding a periphery of the piezoelectric vibrating piece, a base member and a lid member, which nip the piezoelectric vibrator plate from the both main faces side, a sealed chamber which is surrounded by the base member and the lid member, and accommodates the piezoelectric vibrating piece so as to be capable of vibrating, and an external electrode which is provided in the base member, and has been electrically connected to the exciting electrode.

In the piezoelectric vibrator concerned with this invention, it is a three-layer structure type piezoelectric vibrator in which the piezoelectric vibrating piece has been accommodated in the sealed chamber under a sealed state by nipping the piezoelectric vibrator plate by the base member and the lid member and, by applying a predetermined voltage to the external electrode, it is possible to vibrate (bend-vibrate) one pair of vibrating arm parts at a predetermined period through the exciting electrode. Especially, since an inside of the sealed chamber can be made a high vacuum state, it is possible to improve a vibration efficiency of the vibrating arm part.

Further, an oscillator of the present invention is one characterized in that the above piezoelectric vibrator of the present invention is electrically connected to an integrated circuit as an oscillation piece.

In the oscillator concerned with this invention, since there is connected the piezoelectric vibrator having the piezoelectric vibrating piece which has been more miniaturized and whose efficiency has been more increased, similarly it is possible to intend the miniaturization and the increase in efficiency, and it is possible to improve the reliability of the product itself.

Further, an electronic equipment of the present invention is one characterized by possessing the above piezoelectric vibrator of the present invention.

Further, a radio-controlled timepiece of the present invention is one characterized in that the above piezoelectric vibrator of the present invention is electrically connected to a filter section.

In the radio-controlled timepiece and the electronic equipment, which are concerned with this invention, since they have the piezoelectric vibrator which has been more miniaturized and whose efficiency has been more increased, similarly it is possible to intend the miniaturization and the increase in efficiency, and it is possible to improve the reliability of the product itself.

According to the manufacturing method of the piezoelectric vibrating piece concerned with the present invention, by slantingly irradiating the parallel light, since it is possible to form only one exiting electrode on both main faces of the vibrating arm parts having nipped the groove part between them while certainly forming the exciting electrode on the side face of the vibrating arm part and the side face of the groove part, even if the whole size has been made small, it is unnecessary to worry about the contact between the exciting electrodes, so that it is possible to concentratedly form only one exciting electrode with the surplus in the line width. As a result, it is possible to intend the additional miniaturization and the additional increase in efficiency, and it is possible to improve the reliability.

Further, according to the piezoelectric vibrating piece, the piezoelectric vibrator, the oscillator, the radio-controlled timepiece and the electronic equipment, which are concerned with the present invention, it is possible to intend a more miniaturization and a more increase in efficiency, and it is possible to improve the reliability of the product itself.

BRIEF DESCRIPTION OF THE DRAWINGS

FIG. 1 is a view showing one embodiment of a piezoelectric vibrating piece concerned with the present invention, in which a piezoelectric vibrator has been seen from an upper face;

FIG. 2 is a view in which the piezoelectric vibrator shown in FIG. 1 has been seen from a lower face;

FIG. 3 is a sectional view taken along line A-A shown in FIG. 1;

FIG. 12 is a sectional view of the piezoelectric vibrator shown in FIG. 11;

FIG. 13 is a perspective view just before a piezoelectric vibrator plate, a base member and a lid member, which constitute the piezoelectric vibrator shown in FIG. 11, are bonded;

DESCRIPTION OF THE PREFERRED EMBODIMENTS

Hereunder, one embodiment of a piezoelectric vibrating piece concerned with the present invention and one embodiment of a manufacturing method of the piezoelectric vibrating piece are explained by referring to FIG. 1 to FIG. 6.

Incidentally, in the present embodiment, as the piezoelectric vibrating piece, there is explained with a quartz crystal vibrating piece having been formed by a quartz crystal being made an example. However, it is not limited to the quartz crystal, and there may be utilized a piezoelectric material such as tantalic acid lithium and niobic acid lithium.

Figure 4:
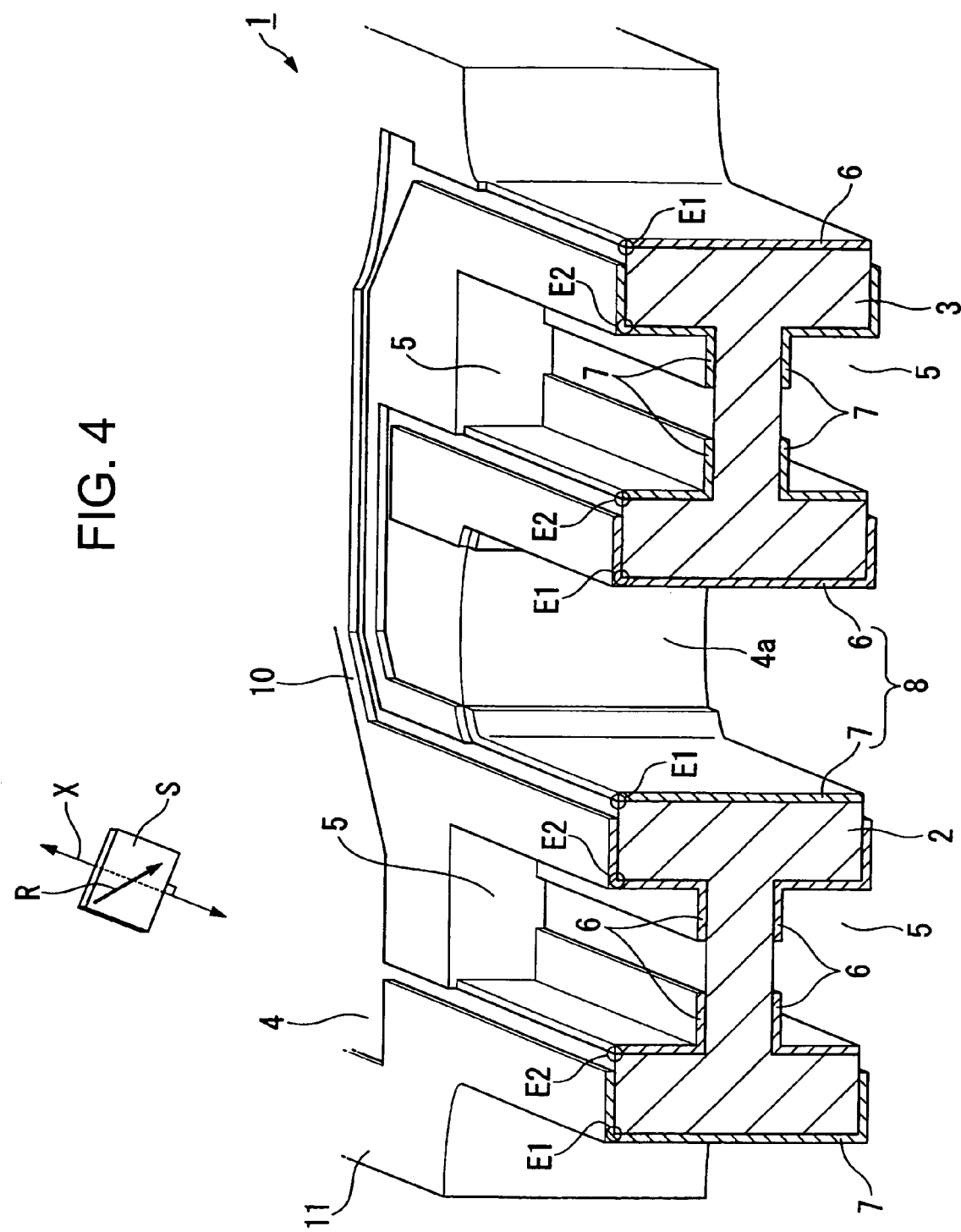
FIG. 4 is a perspective view in which base end side portions of one pair of vibrating arm parts shown in FIG. 1 have been enlarged.

Further, FIG. 1 is a plan view in which the quartz crystal vibrating piece has been seen from above. FIG. 2 is a plan view in which the quartz crystal vibrating piece has been seen from below. FIG. 3 is a sectional view taken along line A-A shown in FIG. 1. FIG. 4 is a perspective view in which base end side portions of one pair of vibrating arm parts have been enlarged.

As shown in FIG. 1 to FIG. 4, a quartz crystal vibrating piece 1 of the present embodiment is a tuning fork type vibrating piece, and possesses one pair of vibrating arm parts 2, 3 having been disposed mutually parallel under an adjoining state, a base part 4 integrally fixing base end sides of the one pair of vibrating arm parts 2, 3, and groove parts 5 having been formed respectively along a longitudinal direction X of the vibrating arm parts 2, 3 on both main faces of the one pair of vibrating arm parts 2, 3. Further, it possesses an exciting electrode 8 comprising a 1st exciting electrode 6 and a 2nd exciting electrode 7, which are formed on outer surfaces of the one pair of vibrating arm parts 2, 3 and which vibrate the one pair of vibrating arm parts 2, 3 at a predetermined resonance frequency in a mutually approaching or separating direction.

As shown in FIG. 1 and FIG. 2, the groove part 5 is formed from a base end side of the vibrating arm parts 2, 3 till an approximately intermediate vicinity. Further, as shown in FIG. 1 to FIG. 4, the 1st exciting electrode 6 and the 2nd exciting electrode 7 are formed on the outer surface of the one pair of vibrating arm parts 2, 3 by being patterned under a state that they are electrically cut off respectively.

Concretely, the 1st exciting electrode 6 is mainly formed on the groove part 5 of one vibrating arm part 2 and on both side faces of the other vibrating arm part 3, and the 2nd exciting electrode 7 is mainly formed on both side faces of one vibrating arm part 2 and on the groove part 5 of the other vibrating arm part 3.

Especially, as shown in FIG. 3 and FIG. 4, on both main faces of the one pair of vibrating arm parts 2, 3 nipping the groove part 5 between them, there becomes a state in which only either electrode 6 (7) of the 1st exciting electrode 6 or the 2nd exciting electrode 7 has been respectively formed under a state electrically cut off from the other electrode 7 (6). About the 1st exciting electrode 6 and the 2nd exciting electrode 7, there will be detailedly explained later.

Further, the 1st exciting electrode 6 and the 2nd exciting electrode 7 are electrically connected, both on the both main faces of the base part 4, to mount electrodes 12, 13 through leader electrodes 10, 11. The quarts vibrator 1 is adapted such that it is electrically connected to an external terminal not shown in the drawing through the mount electrodes 12, 13 and a voltage is applied. Incidentally, the both exciting electrodes 6, 7, the leader electrodes 10, 11 and the mount electrodes 12, 13, which have been mentioned above, are ones having been formed by a coating of an electrically conductive film of, e.g., chromium (Cr), nickel (Ni), aluminum (Al), titanium (Ti) and the like.

Further, as shown in FIG. 1 and FIG. 2, to tips of the one pair of vibrating arm parts 2, 3, there is coated a weight metal film 15 for performing a trimming (frequency trimming) such that own vibration state is vibrated in a predetermined frequency range. Incidentally, this weight metal film 15 is divided into a rough frequency trimming film 15a used when roughly trimming the frequency, and a fine frequency trimming film 15b used when finely trimming it. By performing the frequency trimming by utilizing the rough frequency trimming film 15a and the fine frequency trimming film 15b, it is possible to collect a frequency of the one pair of vibrating arm parts 2, 3 to within a nominal frequency range of a device.

Figure 5:
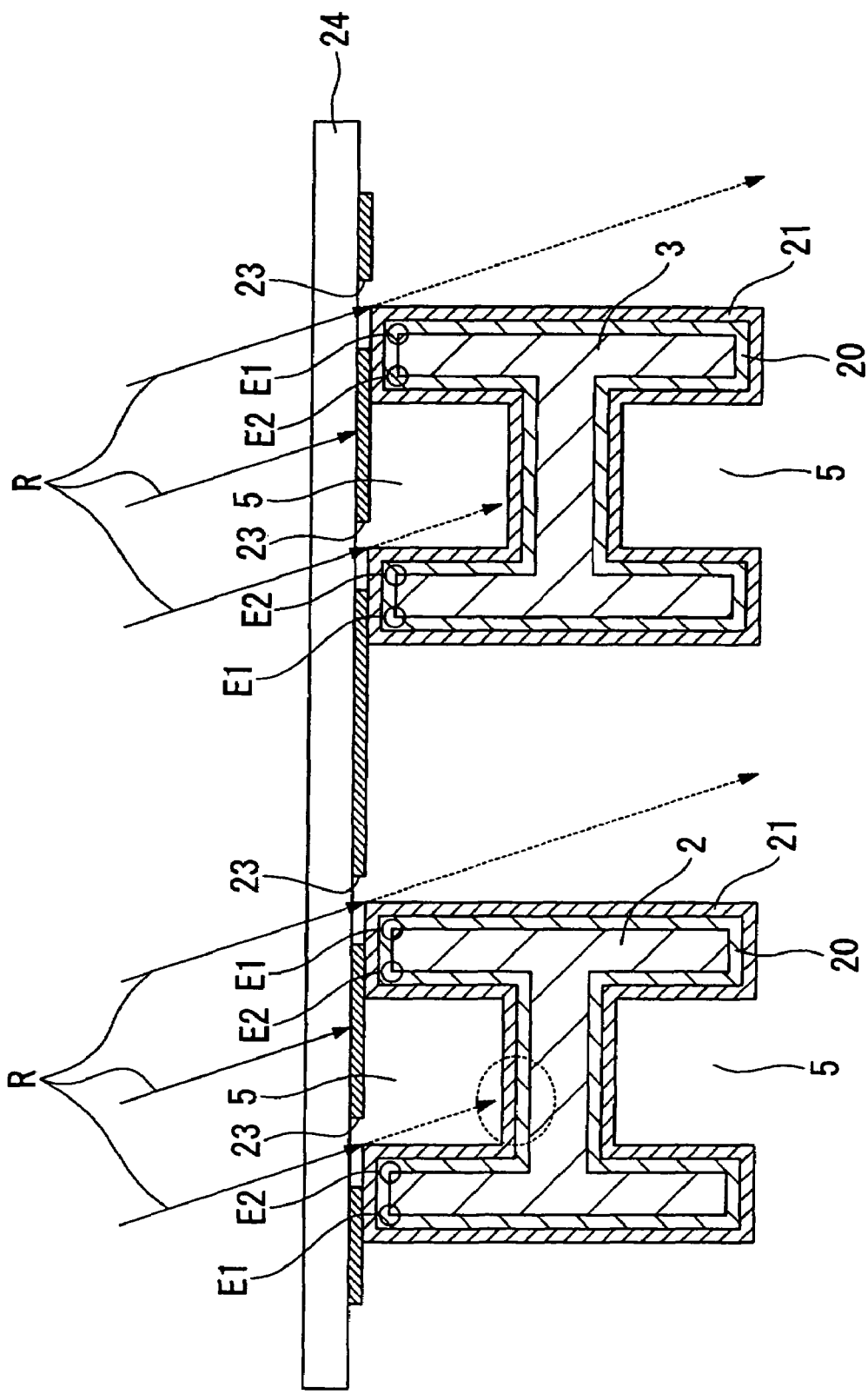
FIG. 5 is a process view which shows a manufacturing method of the piezoelectric vibrating piece shown in FIG. 1, and which shows a state in which, after an electrically conductive film and a photoresist film have been coated on one pair of vibrating arm parts nipping a groove part, a parallel light is being slantingly irradiated through an opening part of a mask.
Figure 6:
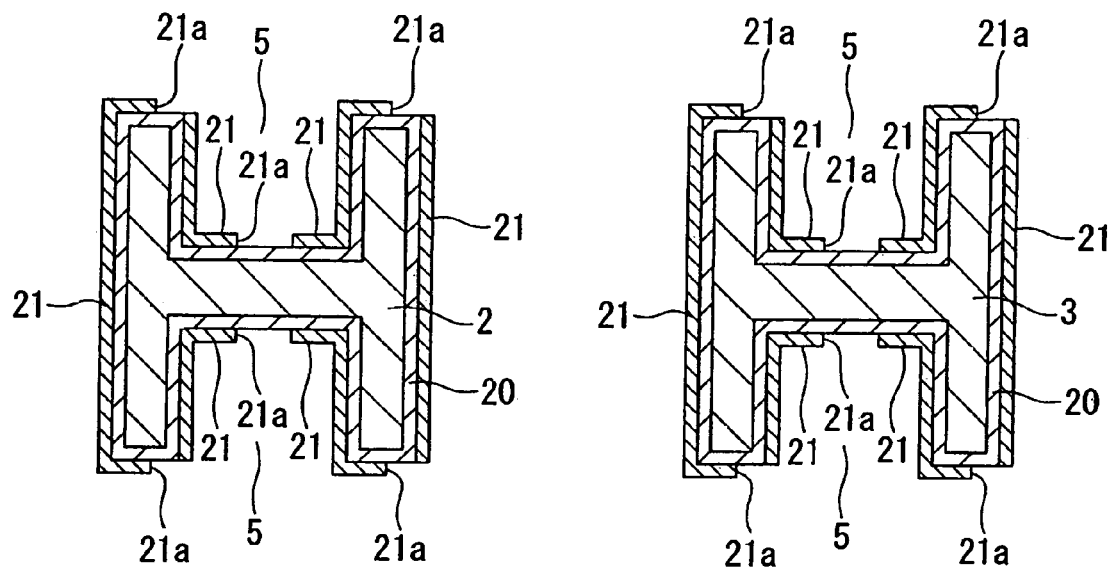
FIG. 6 is a process view which shows the manufacturing method of the piezoelectric vibrating piece shown in FIG. 1, and which shows a state in which, after the state shown in FIG. 5, the photoresist film has been exposed.

Next, a manufacturing method of the above-mentioned quartz crystal vibrating piece 1 is explained while referring to FIG. 5 and FIG. 6. FIG. 5 is one process view showing the manufacturing method of the quartz crystal vibrating piece 1, and is a view showing a state in which an ultraviolet ray is being irradiated by a parallel light R through an opening part 23 of a mask 24 to the one pair of vibrating arm parts 2, 3 to which an electrically conductive film 20 and a photoresist film 21 have been coated. FIG. 6 is one process view showing the manufacturing method of the quartz crystal vibrating piece 1, and is a view showing a state in which the photoresist film 21 having been exposed in FIG. 5 has been removed by a development.

First, a process by a photolithography technique is performed to a quartz crystal wafer (piezoelectric plate) not shown in the drawing, and there is performed a vibrating piece formation process which continuously forms, in a matrix direction by plural number, the quartz crystal vibrating piece 1 comprising the one pair of vibrating arm part 2, 3 in which the groove part 5 has been formed and the base part 4. Subsequently, there is performed an electrode formation process which forms, on both main faces of the quartz crystal wafer, respectively the exciting electrode 8 comprising the 1st exciting electrode 6 and the 2nd exciting electrode 7, the leader electrodes 10, 11 and the mount electrodes 12, 13 by patterning them. Here, there is explained while paying attention to a formation of the exciting electrode 8 in the groove 5 periphery.

In the beginning, as shown in FIG. 5, there is performed a coating process which coats the electrically conductive film 20 of aluminum or the like to a whole outer surfaces of the one pair of vibrating arm parts 2, 3. This electrically conductive film 20 is one which is divided later in a predetermined position, and thereby becomes the 1st exciting electrode 6 and the 2nd exciting electrode 7. Further, by performing the coating process, there becomes a state in which the electrically conductive film 20 has been coated also on the groove part 5. After this coating process, there is performed an application process which additionally applies the photoresist film (photosensitive film) 21 consisting of a positive type photosensitive material by a spray coat and the like.

After the application process, the mask 24 having the opening part 23 to which a predetermined patterning has been previously performed is disposed such that the opening part 23 is located between a 1st edge E1, in two places, which is formed by main faces of the one pair of vibrating arm pats 2, 3 and side faces of the one pair of vibrating arm pats 2, 3, and a 2nd edge E2, in two places, which is formed by main faces of the vibrating arm pats 2, 3 and side face of the groove part 5 on at least either edge.

In the present embodiment, there is used the mask 24 having the two opening parts 23 with respect to one vibrating arm part 2, 3, and the mask 24 is disposed such that each opening part 23 is respectively located on the 1st edge E1 in one place, and on the 2nd edge E2, in one place, which is in a positional relation in which the groove part 5 has been nipped between it and the edge E1.

Subsequently, after disposing the mask 24, there is performed an exposure process in which the photoresist film 21 is exposed by slantingly irradiating the parallel light R from above slantingly toward a bottom face and an outside of the groove part 5 through the opening part 23 while following a face S (shown in FIG. 4) intersecting perpendicularly to the longitudinal direction X of the vibrating arm parts 2, 3.

By this, within the photoresist film 21 having been formed on a main face of the vibrating arm parts 2, 3 nipping the groove part 5, one portions located above the above-mentioned edges E1, E2 become an exposed state by being irradiated by the parallel light R having entered through the opening part 23 of the mask 24. Especially, since the parallel light R is slantingly irradiated toward the above direction, the photoresist film 21 having been applied to the side faces of the vibrating arm parts 2, 3 and the photoresist film 21 having been applied to the side face of the groove part 5 become a shaded state, so that the parallel light R is not irradiated and thus there is no fear of being exposed.

Incidentally, since the parallel light R enters into the groove part 5 through the opening part 23, of the mask 24, having been disposed on the 2nd edge E2 formed by the main face of the vibrating arm parts 2, 3 and the side face of the groove part 5, one portion (region having been surrounded by a dotted line shown in FIG. 5) of the photoresist film 21 having been applied on the bottom face becomes also a state having been exposed.

After the above-mentioned exposure process has finished, also about the other main face (back face) side of the quartz crystal wafer, the exposure process is repeated similarly by using the mask 24. By this, the exposure to both main faces of the one pair of vibrating arm parts 2, 3 is completed.

Incidentally, although there has been explained while paying attention to the exciting electrode 8 in the groove part 5 periphery, the exposure is performed by utilizing the mask so as to become the leader electrodes 10, 11, and the mount electrodes 12, 13.

After the above exposure process has finished, there is performed a development process in which an exposed region is removed by developing the photoresist film 21. By this, as shown in FIG. 6, the photoresist film 21 becomes a state in which an opening 21a has been opened in a portion to which the parallel light R has been irradiated. And, an etching process for etching-working the electrically conductive film 20 is performed with the residual photoresist film 21 being made the mask. By this, the electrically conductive film 20 is shaved in its region adjoining the opening 21a portion of the photoresist film 21, and divided physically and electrically. As a result, as shown in FIG. 3, the 1st exciting electrode 6 and the 2nd exciting electrode 7 can be formed on the outer surfaces of the one pair of vibrating arm parts 2, 3 under a patterned state.

As a result, as shown in FIG. 4, it is possible to manufacture the quartz crystal vibrating piece 1 having the exciting electrodes 8 having been electrically cut off respectively on the 1st edge E1 in one place, and on the 2nd edge E2, in one place, which is in the positional relation in which the groove part 5 has been nipped between it and the edge E1 with respect to each of the vibrating arm parts 2, 3.

Further, after the above electrode formation process has finished, the weight metal film 15 (e.g., silver, gold and the like) comprising the rough frequency trimming film 15a and the fine frequency trimming film 15*b*, which are for the frequency trimming, is coated to tips of the one pair of vibrating arm parts 2, 3. And, to all the vibrating arm parts 2, 3 having been formed in the quartz crystal wafer, there is performed a rough frequency trimming process for roughly trimming the resonance frequency. This is a process for roughly trimming the frequency by reducing a weight applied to the tips of the one pair of vibrating arm part 2, 3 by irradiating a laser light to the rough frequency trimming film 15*a* of the weight metal film 15.

In this manner, the plural quartz crystal vibrating pieces 1 can be formed on the quartz crystal wafer at one time.

Especially, in the manufacturing method of the quartz crystal vibrating piece 1 of the present embodiment, within the photoresist film 21 having been applied to both main faces of the vibrating arm part 2, 3, only one portions located on the 1st and 2nd edges E1, E2 are exposed by slantingly irradiating the parallel light R on the occasion of the exposure process without exposing the photoresist film 21 having been applied to the side faces of the vibrating arm parts 2, 3 and the side face of the groove part 5. For this reason, while forming either exciting electrode 6 (7) on the side faces of the vibrating arm parts 2, 3 and the side face of the groove part 5, it is possible to form only either exciting electrode 6 (7) under a state having been electrically cut off from the other exciting electrode 7 (6) on both main faces of the vibrating arm parts 2, 3 having nipped the groove part 5.

Figure 21:
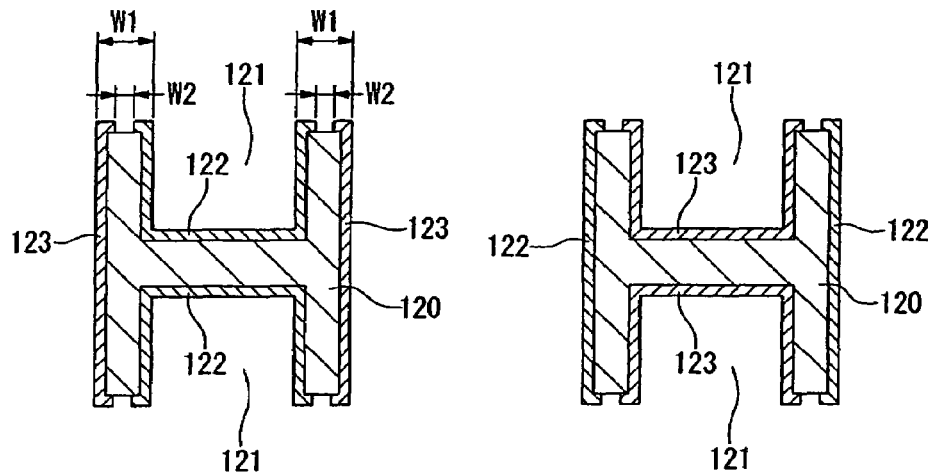
FIG. 21 is a sectional view of conventional one pair of vibrating arm parts having a groove part.
Figure 22:
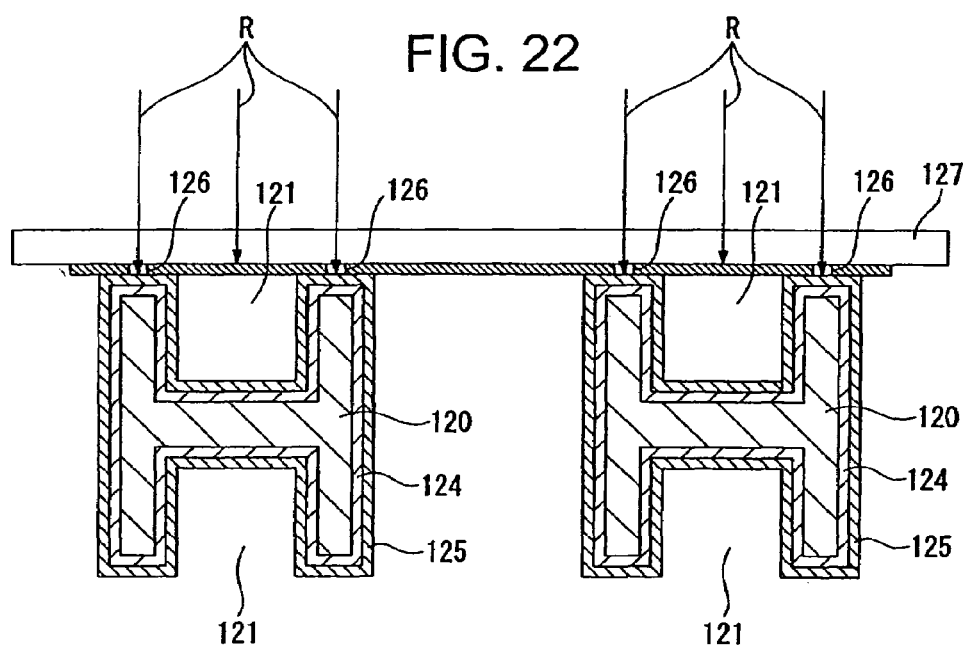
FIG. 22 is a process view in a case where two exciting electrodes are formed on the vibrating arm parts shown in FIG. 21, which shows a state in which, after an electrically conductive film and a photoresist film have been coated on one pair of vibrating arm parts nipping a groove part, a parallel light is being straightly irradiated toward just below from just above through an opening part of a mask.
Figure 23:
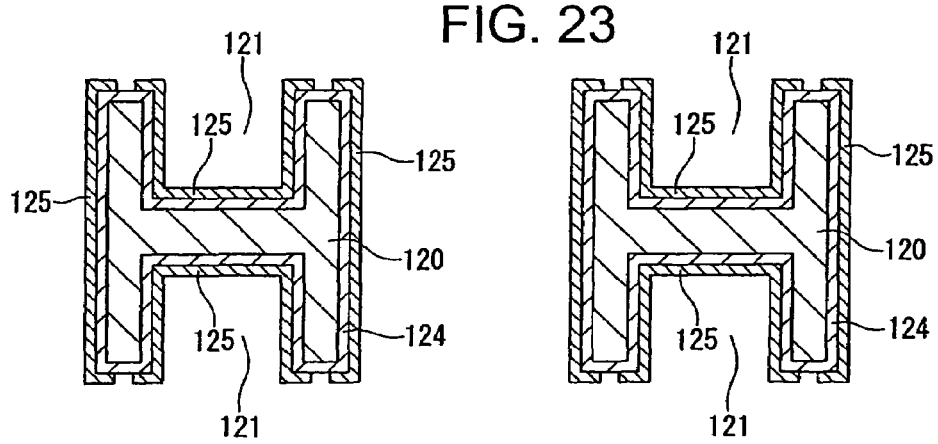
FIG. 23 is a process view in the case where two exciting electrodes are formed on the vibrating arm parts shown in FIG. 21, which shows a state in which, after the state shown in FIG. 22, the photoresist film has been exposed.

Here, hitherto, since the parallel light R has been irradiated toward just below from above the one pair of vibrating arm parts 2, 3 nipping the groove part 5, it has been obliged to expose only the photoresist film 21 located in an approximately intermediate portion on both main faces in order that the light does not impinge against the photoresist film 21 on the side faces of the vibrating arm parts 2, 3 or the side face of the groove part 5. As a result, when a size of the whole has been made small, a problem of a divided electrode width (W2 shown in FIG. 21) has occurred.

In contrast to this, according to the manufacturing method of the present embodiment, as mentioned above, by slantingly irradiating the parallel light R, since it is possible to form, on both main faces of the vibrating arm parts 2, 3 having nipped the groove part 5 between them, only either exciting electrode 6 (7) under the state having been electrically cut off from the other exciting electrode 7 (6) while forming either exciting electrode 6 (7) on the side faces of the vibrating arm parts 2, 3 and the side face of the groove part 5, even if the size of the whole has been made small, the conventional problem of the divided electrode width becomes null, so that an electrode division can be performed easily and certainly.

In other words, since only one exciting electrode 6 (7) can be formed on both main faces of the vibrating arm parts 2, 3 having nipped the groove part 5 between them, even if the size of the whole has been made small, it is unnecessary to worry about a contact between both exciting electrodes 6, 7, so that only either exciting electrode 6 (7) can be concentratedly formed while having a surplus in line width. As a result, an additional miniaturization can be intended. Further, for this reason, by thinning a side wall having been nipped by the side faces of the vibrating arm parts 2, 3 and the side face of the groove part 5, since a spacing between the exciting electrodes 6, 7 can be narrowed, it is possible to improve an electric field efficiency, so that it is possible to intend to increase the efficiency. Therefore, it is possible to improve a reliability.

Incidentally, even if the exciting electrode 6 (7) on the bottom face of the groove part 5 has become partially null by the fact that the photoresist film 21 having been applied to the bottom face of the groove part 5 is exposed, since the exciting electrodes (exciting electrodes in mutually opposed positional relation) 6, 7 formed on the side faces of the vibrating arm parts 2, 3 and the side face of the groove part 5 contribute mainly to a vibration of the vibrating arm parts 2, 3, there is no fact that a vibration characteristic suffers a great influence, so that there is no problem.

Further, hitherto, since the two exciting electrodes 6, 7 are formed on both main faces of the one pair of vibrating arm parts 2, 3 nipping the groove part 5, it has been necessary to highly, accurately dispose the opening part 23 of the mask 24 in a predetermined position. However, according to the manufacturing method of the present embodiment, since only one exciting electrode 6 (7) is formed, it is unnecessary to highly, accurately dispose the mask 24. For this reason, a manufacture becomes easy, and it is possible to intend to shorten a manufacturing time.

Incidentally, when slantingly irradiating the parallel light R in the exposure process, it is good if an incident angle of the parallel light R and a position of the opening part 23 of the mask 24 are adjusted in compliance with a state of the bottom face of the groove part 5. Concretely, when irradiating the parallel light R toward the bottom face of the groove part 5, it is good if the incident angle of the parallel light R and the position of the opening part 23 of the mask 24 are adjusted such that a plane region or a deepest part of the photoresist film 21 having been formed on the bottom face of the groove part 5 is irradiated.

This is because, from a relation between a groove width and a groove depth, it is not limited that the bottom face of the groove part 5 necessarily becomes a plane state much influencing on the vibration characteristic, and there is a case where it becomes a partially slant face state. Since the exciting electrode 6 (7) having been formed in the upper face becoming this slant state becomes a positional relation slightly facing on the exciting electrode 6 (7) formed on the side faces of the vibrating arm parts 2, 3, it becomes an exciting electrode liable to contribute to the vibration of the vibrating arm parts 2, 3. Therefore, as mentioned above, by exposing only the photoresist film 21 in the plane region or the deepest part, it is possible to leave as much as possible this exciting electric power contributing to the vibration, so that it is possible to intend to additionally increase the efficiency.

Figure 7:
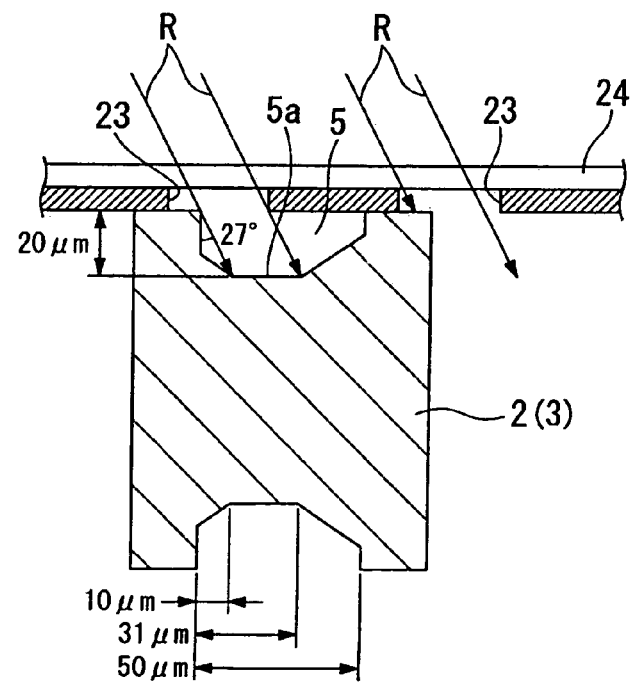
FIG. 7 is a view showing one example of a method of applying the parallel light to the vibrating arm part having a groove part whose groove depth with respect to its groove width is comparatively shallow.
Figure 8:
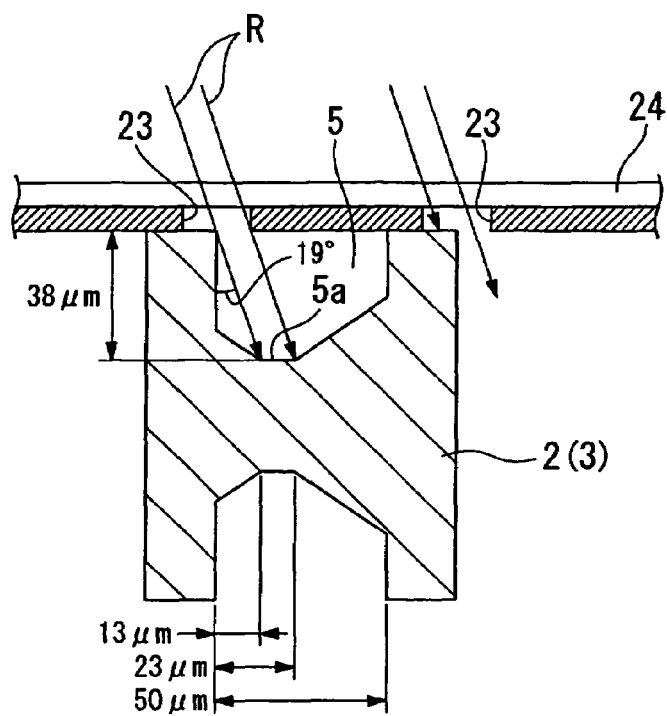
FIG. 8 is a view showing one example of the method of applying the parallel light to the vibrating arm part having the groove part whose groove depth with respect to its groove width is comparatively deep.
Figure 9:
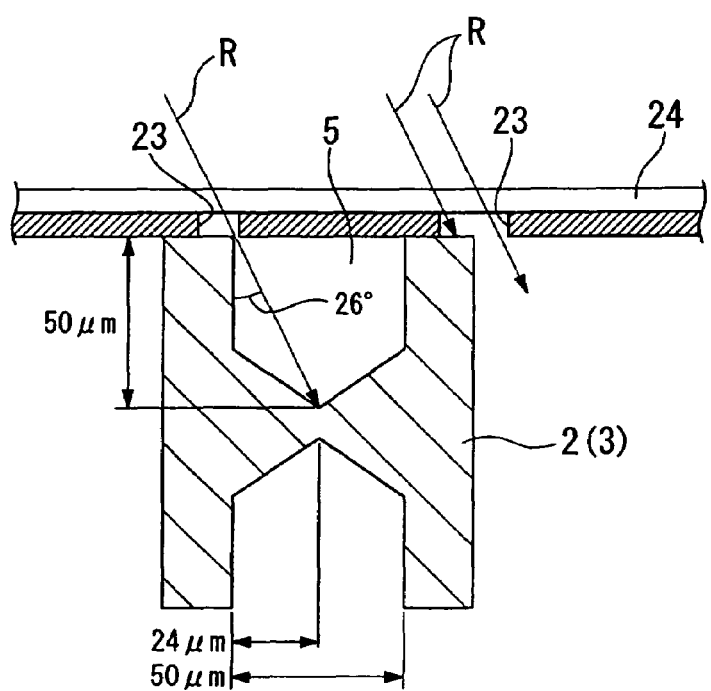
FIG. 9 is a view showing one example of the method of applying the parallel light to the vibrating arm part having the groove part whose groove depth with respect to its groove width is considerably deep.

Concretely, there is explained below while referring to FIG. 7 to FIG. 9. Incidentally, FIG. 7 is a view showing a method of impinging the parallel light against the vibrating arm part having the groove part whose groove depth with respect to the groove width is comparatively shallow. FIG. 8 is a view showing a method of impinging the parallel light against the vibrating arm part having the groove part whose groove depth with respect to the groove width is comparatively deep. FIG. 9 is a view showing a method of impinging the parallel light against the vibrating arm part having the groove part whose groove depth with respect to the groove width is considerably deep.

For example, as shown in FIG. 7, in the case where the groove depth with respect to the groove width is comparatively shallow, a plane region 5*a* of the bottom face of the groove part 5 is largely formed. Therefore, in this case, it is ideal that the position of the opening part 23 of the mask 24 is adjusted such that only the plane region 5*a* is exposed, and an exposure angle of the parallel light R is largely adjusted.

Further, as shown in FIG. 8, in the case where the groove depth with respect to the groove width is comparatively deep, the plane region 5*a* of the bottom face of the groove part 5 is small formed. Therefore, in this case, it is ideal that the position of the opening part 23 of the mask 24 is adjusted such that only the plane region 5a is exposed, and the exposure angle of the parallel light R is small adjusted.

Additionally, as shown in FIG. 9, in the case where the groove depth with respect to the groove width is considerably deep, the plane region 5a of the bottom face of the groove part 5 is not formed. Therefore, in this case, it is ideal that the position of the opening part 23 of the mask 24 is adjusted and the exposure angle of the parallel light R is adjusted such that only a deepest part is exposed at a pinpoint.

Figure 10:
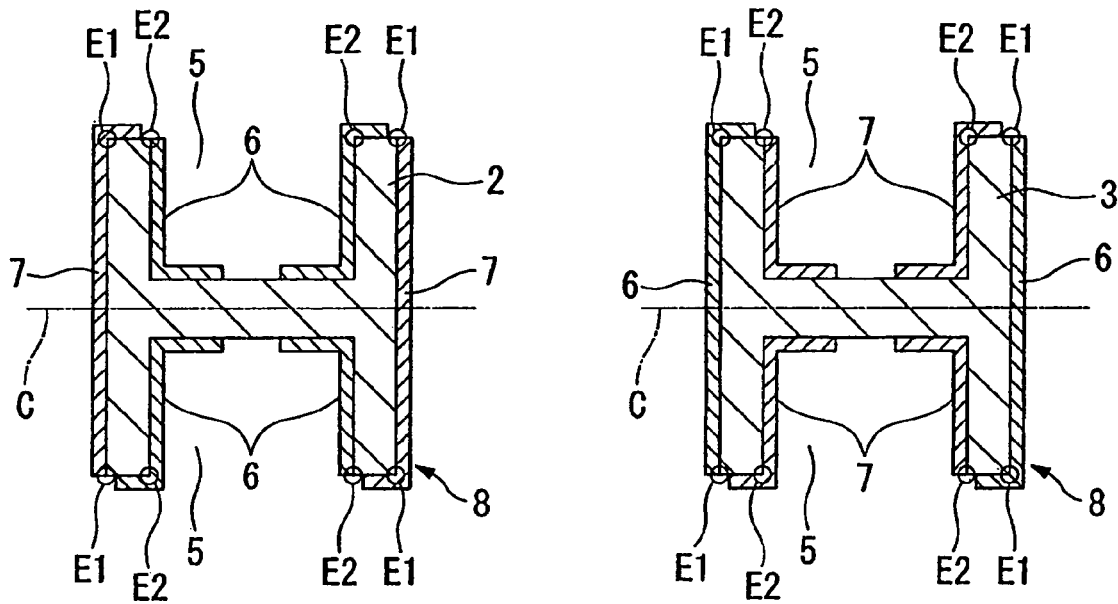
FIG. 10 is a view which shows other example of the piezoelectric vibrating piece shown in FIG. 1, and which is a sectional view of the piezoelectric vibrator in which an electrode-cutting-off point of an exciting electrode is different.

Further, in the above embodiment, as shown in FIG. 3, with respect to each of the vibrating arm parts 2, 3, although the exciting electrode 8 having been electrically cut off has been formed on the 1st edge E1 and the 2nd edge E2 so as to become vertically symmetric about a center line C, there is not limited to this case. Concretely, other example is explained while referring to FIG. 10. FIG. 10 is a view showing a state in which the exciting electrode 8 has been formed so as to become vertically asymmetric about the center line C.

As shown in FIG. 10, with respect to each of the vibrating arm parts 2, 3, an electric cutting-off position may be changed in one main face (front face) and the other main face (back face) so as to become vertically asymmetric about the center line C. In any case, it suffices if the exciting electrode 8 is formed so as to be electrically cut off respectively on the 1st edge E1 in one place and on the 2nd edge E2, in one place, which is in the positional relation in which the groove part 5 is nipped between it and the edge E1.

However, in the quartz crystal whose crystal structure is anisotropic, it becomes a sectional shape of vertically, approximately symmetric about the center line C in a contour formation and a groove formation by the etching (refer to sectional views shown in FIG. 7, FIG. 8 and FIG. 9). Accordingly, when vertically, asymmetrically forming the exciting electrode 8 in the quartz crystal of the vertically, approximately symmetric sectional shape, it is desirable to suitably change vertically not only the irradiation direction of the parallel light R but also the exposure angle.

Next, there is explained about one embodiment of the piezoelectric vibrator concerned with the present invention by referring to FIG. 11 to FIG. 15. Incidentally, in the present embodiment, as an example of the piezoelectric vibrator, there is explained with a surface mount type piezoelectric vibrator 30, that is a three-layer structure package in which a quartz crystal vibrator plate (piezoelectric vibrator plate) 31 having the above-mentioned quartz crystal vibrating piece 1 has been nipped by a base member 32 and a lid member 33, being made an example. Incidentally, in the present embodiment, about the same constitution as the above embodiment, the same reference numeral is applied, and its explanation is omitted.

Figure 11:
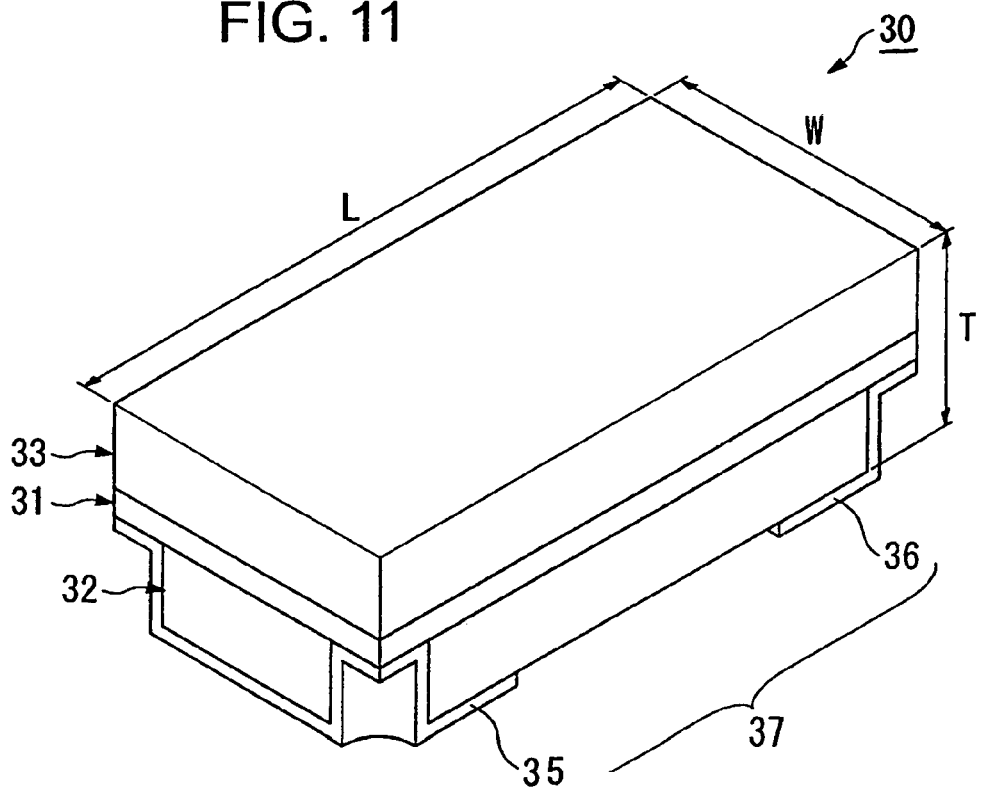
FIG. 11 is a perspective view showing one embodiment a surface mount type piezoelectric vibrator having the piezoelectric vibrating piece of the present invention.
Figure 14:
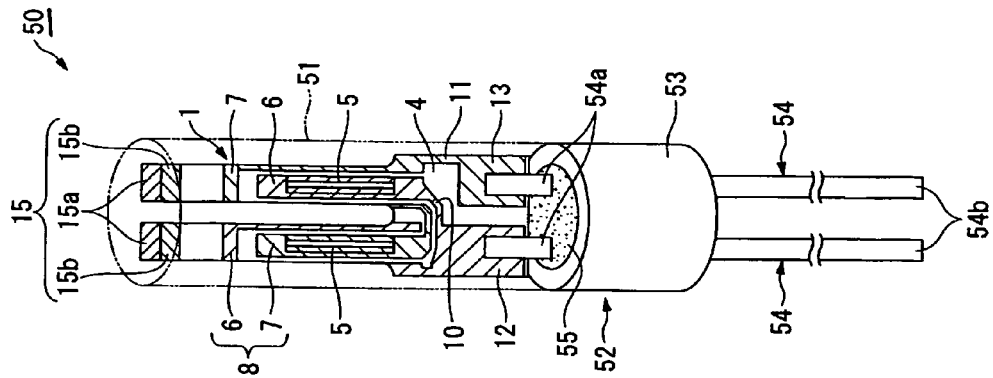
FIG. 14 is a view in which the piezoelectric vibrator plate shown in FIG. 13 has been seen from above.
Figure 15:
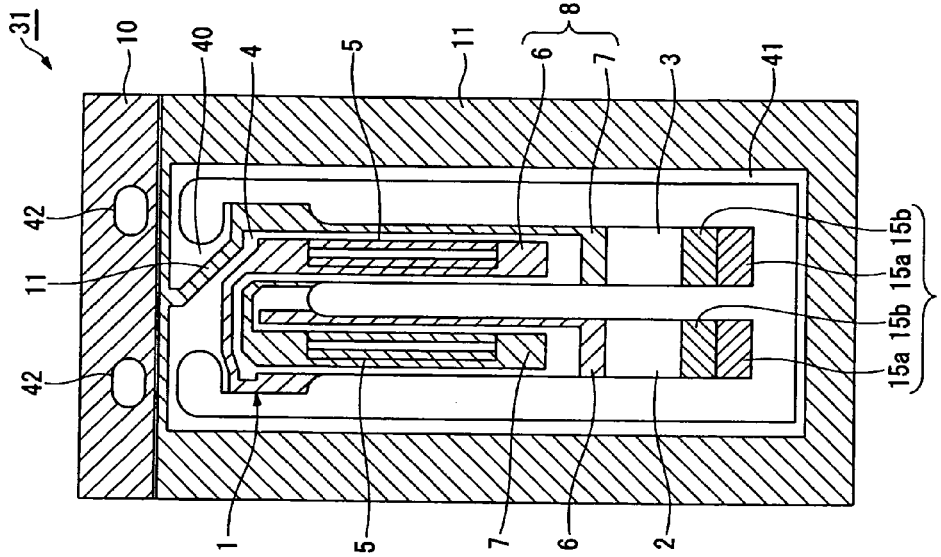
FIG. 15 is a view in which the piezoelectric vibrator plate shown in FIG. 13 has been seen from below.

Further, FIG. 11 is a view showing an external appearance of the piezoelectric vibrator. FIG. 12 is a view showing a section of the piezoelectric vibrator. FIG. 13 is a view showing a state just before the quartz crystal vibrator plate, the base member and the lid member are bonded. FIG. 14 is a view in which the quartz crystal vibrator plate has been seen from above. FIG. 15 is a view in which the quartz crystal vibrator plate has been seen from below.

Incidentally, the quartz crystal vibrating piece 1 shown in FIG. 14 and FIG. 15 differs from the quartz crystal vibrating piece shown in FIG. 1 and, since it is integrally connected to a frame-like part, a mount electrode is unnecessary.

As shown in FIG. 11 to FIG. 15, the piezoelectric vibrator 30 of the present embodiment possesses the quartz crystal vibrator plate 31, the base member 32 and the lid member 33 which nip the quartz crystal vibrator plate 31 from both main face sides, a sealed chamber 34 which is surrounded by the base member 32 and the lid member 33 and which accommodates the quartz crystal vibrating piece 1 so as to be capable of vibrating, and an external electrode 37 which is provided in the base member 32 and which comprises a 1st external electrode 35 and a 2nd external electrode 36, which have been electrically connected to the exciting electrode 8 comprising the 1st exciting electrode 6 and the 2nd exciting electrode 7.

Incidentally, a size of the piezoelectric vibrator 30 of the present embodiment is, e.g., 1 mm in thickness (T), 1.2 mm in width (W), and 3.2 mm in length (L).

As shown in FIG. 13 to FIG. 15, the quartz crystal vibrator plate 31 possesses the quartz crystal vibrating piece 1, and a frame-like part 41 which integrally supports the base part 4 of the quartz crystal vibrating piece 1 through a connection part 40 and which surrounds a periphery of the quartz crystal vibrating piece 1. Incidentally, in the present embodiment, as shown in FIG. 14, the leader electrode 10 having been electrically connected to the 1st exciting electrode 6 is formed over the whole surface of the frame-like part 41, and formed till the other main face (back face) side of the quartz crystal vibrator plate 31 through inner periphery faces of two through-holes 42 having been formed in one end side (base part 4 side) of the frame-like part 41.

Further, as shown in FIG. 15, the leader electrode 11 having been electrically connected to the 2nd exciting electrode 7 is formed over most portion of the surface of the frame-like part 41 in the other main face (back face) side of the quartz crystal vibrator plate 31. On this occasion, the leader electrode 11 is partitioned from the leader electrode 10 having been formed till the other main face side through the through-hole 42 under a state having been electrically cut off in the vicinity of the through-hole 42.

Incidentally, there is adapted such that both leader electrodes 10, 11 function also as bonding electrodes when anode-bonding the quartz crystal vibrator plate 31 and the base member 32 as well as the lid member 33. For it, Al (aluminum) is suitably used.

As shown in FIG. 13, in the base member 32, a rectangular concave part 43 of a size, in which the quartz crystal vibrating piece 1 is accommodated, is formed in a bonding face side to which the quartz crystal vibrator plate 31 is bonded. This concave part 43 is formed so as to become deeper over one side from an approximately center vicinity. Further, similarly also in the lid member 33, a concave part 44 of the same size as the concave part 43 is formed so as to oppose to the bonding face side to which the quartz crystal vibrator plate 31 is bonded. By this, there is adapted such that, when the quartz crystal vibrator plate 31 has been nipped by the base member 32 and the lid member 33, both concave parts 43, 44 are overlapped as shown in FIG. 12, and thus a space, i.e., the above sealed chamber 34 is formed.

Especially, since both concave part 43, 44 change in their depths from a midway as mentioned above, there is adapted such that tip sides of the one pair of vibrating arm parts 2, 3 are accommodated in a wider space. By this, the tips are difficult to contact with the base member 32 and the lid member 33 even if the tip sides of the vibrating arm parts 2, 3 which are made free ends are deformed and bent by undergoing an external force by an impact or the like at a drop time. Therefore, a safety is increased and the reliability of a product is improved.

Further, as shown in FIG. 13, in four corner parts of the base member 32, ¼ arc-like notch parts 45 when seen from above are formed over a thickness direction. And, as shown in FIG. 11 and FIG. 12, there is adapted such that the electrically conductive film 20 is formed over an inner periphery face of the notch part 45 and a back face of the base member 32 and thereby the 1st external electrode 35 and the 2nd external electrode 36 are respectively constituted.

In other words, the 1st external electrode 35 is electrically connected to the leader electrode 10 (functioning also as a bonding electrode) having been formed in the other main face side of the base member 32 through inner periphery faces of the two notch parts 45 having been formed in one end side of the base member 32. Further, the 2nd external electrode 36 is electrically connected to the leader electrode 11 (functioning also as a bonding electrode) having been formed in the other main face side of the base member 32 through inner periphery faces of the residual two notch parts 45 having been formed in the other end side of the base member 32.

Next, a manufacturing method of the piezoelectric vibrator 30 of the present embodiment is explained below. Incidentally, in this explanation, as to the manufacturing method of the quarts crystal vibrating piece 1, the explanation is omitted because there is explained in the above-mentioned manufacturing method of the quartz crystal vibrating piece.

The manufacturing method of the piezoelectric vibrator 30 of the present embodiment is a method in which after a quartz crystal wafer (piezoelectric plate) not shown in the drawing, which becomes the quartz crystal vibrator plate 31, and a wafer for the base and a wafer for the lid, which are not shown in the drawing, which become the base member 32 and the lid member 33, and which consist of a soda-lime glass or the like, have been respectively working-processed, they are anode-bonded and, thereafter, the bonded three wafers are cut by a dicing blade, thereby manufacturing the plural piezoelectric vibrator 30 at a time. There is detailedly explained below.

First, a quartz crystal lambert raw ore is cut by a wire saw with a predetermined cutting angle, thereby cutting out a substrate becoming a source of the wafer. Subsequently, the cut-out substrate is subjected to an abrasion working of lapping and polishing and a washing, thereby preparing the quartz crystal wafer of a predetermined thickness, whose both faces have been finished to a mirror surface state.

Subsequently, by performing a process by the photolithography technique to the quartz crystal wafer, there is performed a vibrator formation process in which the crystal quartz vibrating piece 1, and the frame-like part 41 integrally connection-supporting the base part 4 of the crystal quartz vibrating piece 1 through the connection part 40 are continuously formed, by plural number, in the matrix direction. Further, on this occasion, the two through-holes 42 are also formed in the frame-like part 41 at the same time.

Subsequently, there is performed an electrode formation process in which the exciting electrode 8 comprising the 1st exciting electrode 6 and the 2nd exciting electrode 7 is formed in both main faces of the quartz crystal wafer by pattering it. About this electrode formation process, the explanation is omitted as mentioned above. Incidentally, at the same time as the formation of the exciting electrode 8, both leader electrodes 10, 11 are also formed in both main faces of the quartz crystal vibrator plate 31 by being patterned.

Subsequently, there is performed a working of the wafer for the base. First, a glass substrate of the soda-lime glass or the like is abrasion-worked till a predetermined thickness and washed. And, a working deterioration portion of a most-surface is removed by an etching or the like. Subsequently, there is performed a concave part formation process in which the concave part 43 becoming the sealed chamber 34 is formed in a bonding face side of the wafer for the base by the etching or the like. On this occasion, it is continuously formed, by plural number, in the matrix direction so as to face on the plural quartz crystal vibrating pieces 1 having been formed in the quartz crystal wafer. Further, when forming the concave part 43, the working is performed so as to become deeper from the approximately center vicinity over one side.

After the formation of the concave part 43, four through-holes not shown in the drawing are formed by a sand blast or the like so as to surround each concave part 43 by a predetermined size. This is one becoming later the notch part 45 of the base member 32, and an inside portion having been surrounded by these four through-holes becomes a portion corresponding to the frame-like part 41.

Subsequently, there is performed a bevel cut process in which the bonding face side of the wafer for the base is stuck to a dicing tape, and a V-groove is cut in a cut spacing dimension of the piezoelectric vibrator 30 by a dicing saw. By this, it follows that, in a non-bonding face side of the wafer for the base, there is formed a lattice-like groove so as to surround the plural piezoelectric vibrators 30.

Next, there is performed a working of the wafer for the lid. Also about this wafer for the lid, similarly to the working of the wafer for the base, after performing the abrasion working and washing of the glass substrate, there is performed the removal of the working deterioration portion of the most-surface. And, there is performed a concave part formation process in which in the bonding face side there is formed, by plural number, the concave part 44 of the same shape and size so as to face on the concave part 43 of the wafer for the base. Further, similarly to the wafer for the base, also to the wafer for the lid there is performed the bevel cut process, and the lattice-like V-groove is formed in a non-bonding face side so as to surround the plural piezoelectric vibrators 30.

After the above-mentioned workings of the quartz crystal wafer, the wafer for the base and the wafer for the lid have wholly finished, the wafer for the base and the wafer for the lid are overlapped so as to nip the quartz crystal wafer under a state having been precisely positioned. By this, there becomes a state in which the quartz crystal vibrating piece 1 comprising the one pair of vibrating arm parts 2, 3 has been accommodated in the sealed chamber 34 formed by the concave part 43 of the wafer for the base and the concave part 44 of the wafer for the lid.

Subsequently, the overlapped three wafers are set to a jig for the anodic bonding, and there is performed an anodic bonding process in which they are mutually bonded by the anodic bonding in a vacuum atmosphere. That is, after the three wafers have been heated till a predetermined temperature, if a predetermined voltage is applied by a voltage application device or the like, an electrochemical reaction occurs in interfaces between an electrode for the bonding and the wafer for the base and between the electrode for the bonding and the wafer for the lid, so that both are respectively, closely adhered and anode-bonded. By this, an inside of the sealed chamber 34 is airtightly sealed in the vacuum.

After the above anodic bonding has finished, there is performed an external electrode formation process in which, by using a metal mask, a metal film becoming the 1st external electrode 35 and the 2nd external electrode 36 is formed in the wafer for the base by a sputtering, a vapor deposition or the like. The 1st external electrode 35 having been formed here becomes a state having been electrically connected to the 1st exciting electrode 6 through the leader electrode 10 and the through-hole 42. Further, the 2nd external electrode 36 becomes a state having been directly, electrically connected to the 2nd exciting electrode 7 through the leader electrode 11.

Subsequently, under a state that a back face of the wafer for the base has been stuck to the dicing tape, it is set to the dicing saw. And, there is performed a cut process in which a full cut is performed by the dicing blade along the lattice-like groove having been formed in the bevel cut process. By this full cut, it follows that the through-hole is divided into four, and the ¼ arc-like notch part 45 is formed. And, by exfoliating the dicing tape, the plural piezoelectric vibrators 30 can be manufactured at a time.

Thereafter, there is performed a fine frequency trimming process in which a frequency of the individual piezoelectric vibrator 30 is collected in a predetermined range by finely trimming the frequency. That is, by irradiating the laser light from an outside through the base member 32 and the lid member 33, which consist of a glass that is a transparent body, there is evaporated the fine frequency trimming film 15b of the weight metal film 15 for trimming the frequency, which has been formed in the tips of the one pair of vibrating arm parts 2, 3. By this, since the weight in the tip side of the one pair of vibrating arm parts 2, 3 changes, it is possible to finely trim the frequency of the quartz crystal vibrating piece 1 so as to be collected in a predetermined range of the nominal frequency.

Finally, by coating a corrosion resist film to a surface of the piezoelectric vibrator 30 excluding the external electrode 37 comprising the 1st external electrode 35 and the 2nd external electrode 36, an environmental resistance performance is improved. With this, the manufacture of the piezoelectric vibrator 30 is finished.

According to the piezoelectric vibrator 30 of the present embodiment, since it has the quartz crystal vibrating piece 1 which has been more miniaturized and whose efficiency has been more increased, it is also possible to intend the miniaturization and the increase in the efficiency of the piezoelectric vibrator 30 itself, and the reliability of the product can be improved. Especially, since the inside of the sealed chamber 34 can be made a high vacuum state, a vibration efficiency of the one pair of vibrating arm parts 2, 3 can be improved.

Figure 16:
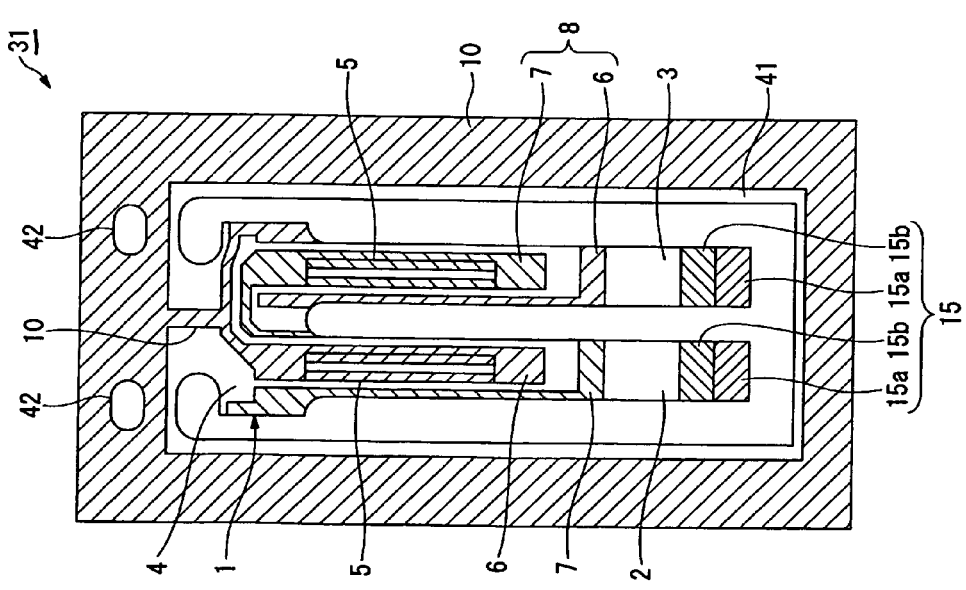
FIG. 16 is a view showing one embodiment of a cylinder shape package type piezoelectric vibrator having the piezoelectric vibrating piece concerned with the present invention.

Next, about other example of the piezoelectric vibrator having the piezoelectric vibrating piece concerned with the present invention, there is explained by referring to FIG. 16. Incidentally, in the present embodiment, there is explained with a cylinder package type piezoelectric vibrator being made an example as the piezoelectric vibrator. FIG. 16 is a view showing a constitution of the piezoelectric vibrator.

As shown in FIG. 16, a piezoelectric vibrator 50 of the present embodiment possesses the quartz crystal vibrating piece 1, a bottomed cylindrical case 51 accommodating in its inside the quartz crystal vibrating piece 1, and an airtight terminal 52 sealing the quartz crystal vibrating piece 1 in the case 51.

The airtight terminal 52 is constituted by an annular stem 53 having been formed by a metallic material, two leads 54 disposed so as to penetrate through the stem 53 and having been electrically and physically connected respectively to both mount electrodes 12, 13 of the quartz crystal vibrating piece 1, and a filler 55 integrally fixing the leads 54 and the stem 53 under an insulated state and sealing the inside of the case 51. A material of the filler 55 is, e.g., bolosilicate glass or the like. Incidentally, as to the two leads 54, portions protruding into the case 51 become inner leads 54a, and portions protruding outside the case 51 become outer leads 54b. And, there is adapted such that this outer lead 54b functions as an external connection terminal.

The case 51 is pressed-in to an outer periphery of the stem 53 of the airtight terminal 52, thereby being fitted and fixed thereto. Since this press-in of the case 51 is performed under a vacuum atmosphere, a space surrounding the quartz crystal vibrating piece 1 in the case 51 is sealed under a state having been held in vacuum.

Also in the cylinder shape package type piezoelectric vibrator 50 having been constituted like this, since it has the quartz crystal vibrating piece 1 which has been miniaturized and whose efficiency has been increased, similarly to the above-mentioned piezoelectric vibrator 30, it is possible to intend the additional miniaturization and the additional increase in efficiency.

Figure 17A:
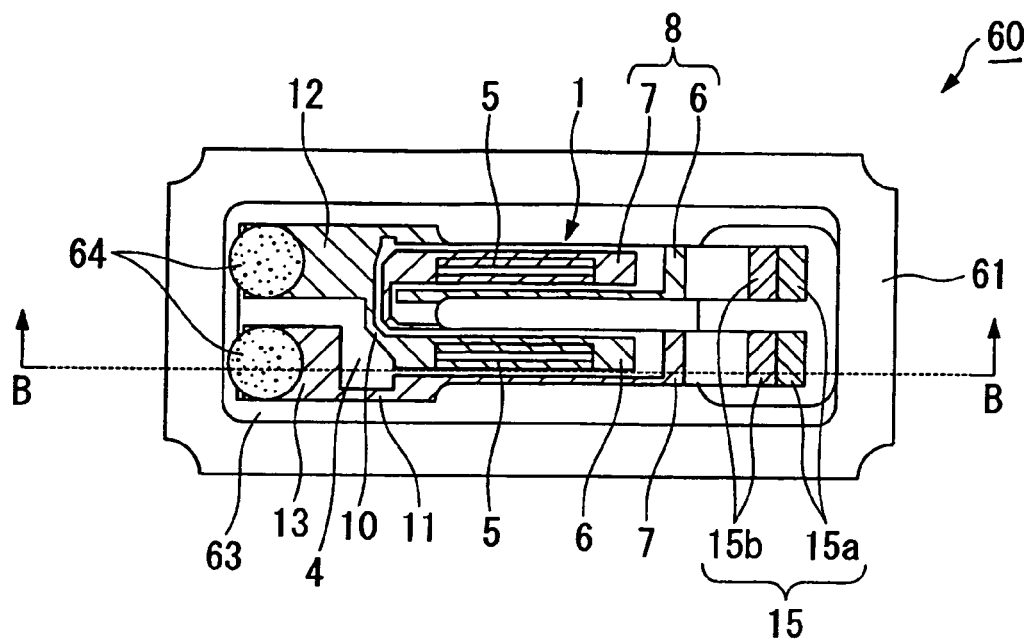
FIGS. 17A and 17B are views showing one embodiment of a ceramic package type piezoelectric vibrator having the piezoelectric vibrating piece concerned with the present invention, wherein 17A is a view in which the piezoelectric vibrating piece having been fixed to a base has been seen from above, and 17B is a sectional view taken along line B-B shown in 17A.
Figure 17B:
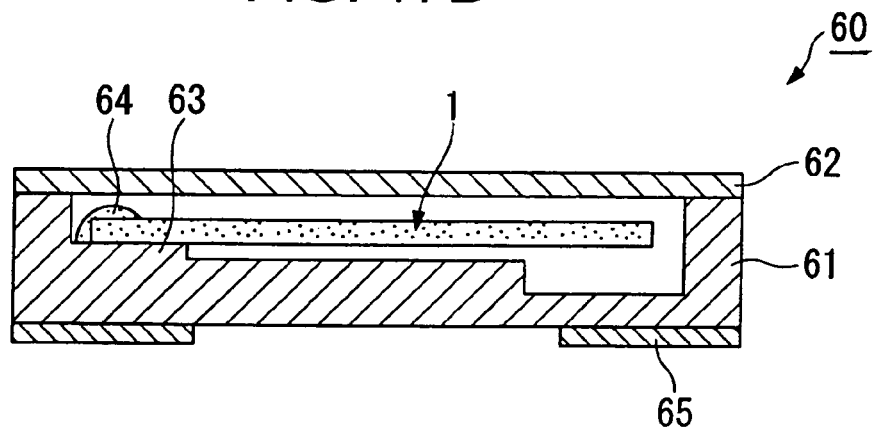

Next, about other example of the piezoelectric vibrator having the piezoelectric vibrating piece concerned with the present invention, there is explained by referring to FIG. 17. Incidentally, in the present embodiment, there is explained with a ceramic package type piezoelectric vibrator, in which the piezoelectric vibrating piece has been fixed to an inside of a lidded box, being made an example as the piezoelectric vibrator. FIGS. 17A and 17B are views showing a constitution of the piezoelectric vibrator, wherein 17A is a view in which the base of the piezoelectric vibrator and the quartz crystal vibrating piece have been seen from above, and 17B is a sectional view taken along line B-B in 17A.

A piezoelectric vibrator 60 of the present embodiment is constituted by the quartz crystal vibrating piece 1, a base 61 and a lid 62. The base part 4 of the quartz crystal vibrating piece 1 is fixed to a bonding part 63 of the base 61 by being adhered by an electrically conductive adhesive 64. Further, the base 61 is vacuum-airtight-sealed by the metal-made lid 62 becoming a lid by using various means, such as electron beam welding and vacuum seam welding, in the vacuum. Further, the mount electrodes 12, 13 having been formed on the base pat 4 of the quartz crystal vibrating piece 1 are electrically connected to an external electrode 65 outside the base 61 by an internal connection not shown in the drawing through the bonding part 63.

Also in the ceramic package type piezoelectric vibrator 60 having been constituted like this, since it has the quartz crystal vibrating piece 1 which has been miniaturized and whose efficiency has been increased, it is possible to intend the additional miniaturization and the additional increase in efficiency.

Figure 18:
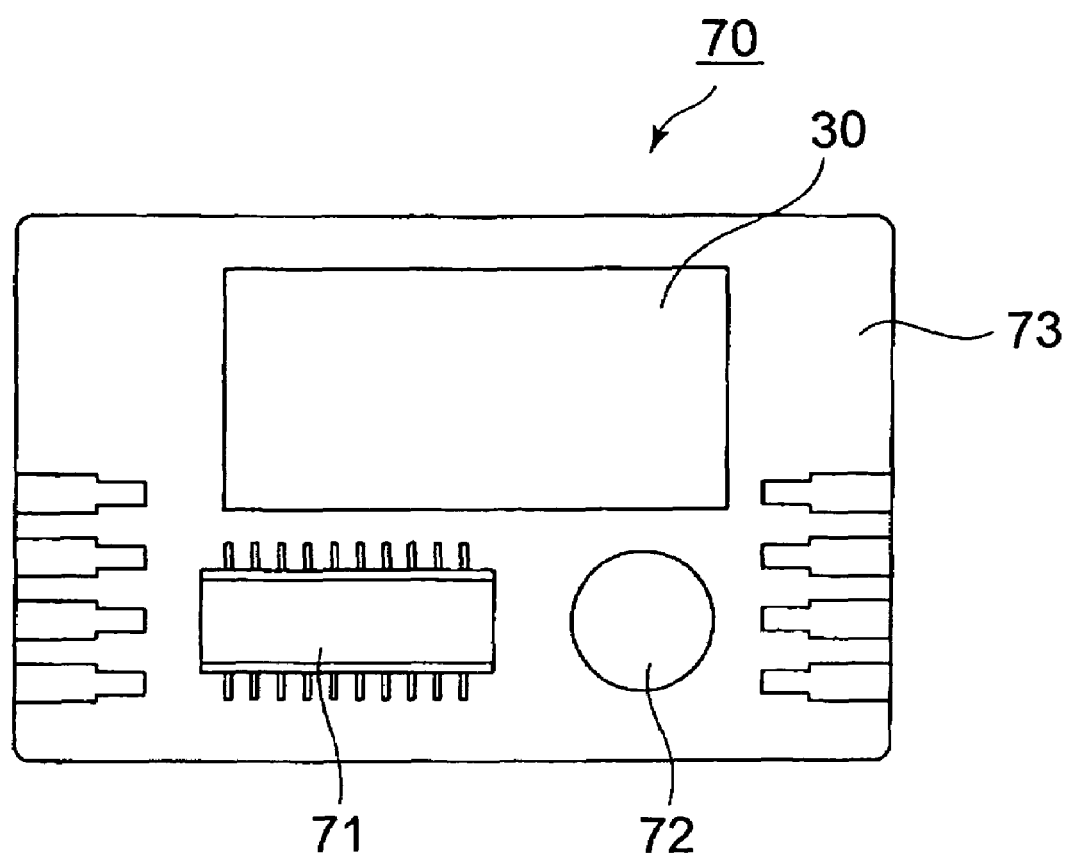
FIG. 18 is a constitutional view showing one embodiment of an oscillator having the piezoelectric vibrating piece concerned with the present invention.

Next, about one embodiment of an oscillator concerned with the present invention, there is explained while referring to FIG. 18. FIG. 18 is a view showing a constitution of the oscillator having possessed the piezoelectric vibrator 30 having the quartz crystal vibrating piece 1 (not shown in the drawing).

As shown in FIG. 18, an oscillator 70 of the present embodiment is one in which the piezoelectric vibrator 30 has been constituted as an oscillation piece having been electrically connected to an integrated circuit 71. This oscillator 70 possesses a substrate 73 in which there has been mounted an electric component 72 such as capacitor. The integrated circuit 71 for the oscillator is mounted in the substrate 73, and the piezoelectric vibrator 30 is mounted in the vicinity of the integrated circuit 71. The electronic component 72, the integrated circuit 71 and the piezoelectric vibrator 30 are respectively, electrically connected by a wiring pattern not shown in the drawing. Incidentally, each constitutional component is molded by a resin not shown in the drawing.

In the oscillator 70 having been constituted like this, if a voltage is applied to the piezoelectric vibrator 30, the quartz crystal vibrating piece 1 in the piezoelectric vibrator 30 vibrates, this vibration is converted into an electric signal by a piezoelectric characteristic that the quartz crystal has, and it is inputted to the integrated circuit 71 as the electric signal. The inputted electric signal is subjected to various treatments by the integrated circuit 71, and outputted as a frequency signal. By this, the piezoelectric vibrator 30 functions as an oscillation piece.

Further, as to a constitution of the integrated circuit 71, e.g., by selectively setting an RTC (Real Time Clock) module or the like in compliance with a demand, it is possible to add a function which controls an operation date and a time instant of an equipment and an external equipment besides a single-function oscillator for timepiece or the like, and which provides the time instant, a calendar or the like.

As mentioned above, according to the oscillator 70 of the present embodiment, since it possesses the piezoelectric vibrator 30 which has been more miniaturized and whose efficiency has been more increased, also the oscillator 70 itself can be miniaturized and increased in its efficiency, and the reliability of the product can be improved. Further, in addition to this, it is possible to obtain a stable and highly accurate frequency signal for a long term.

Incidentally, although the above oscillator 70 has been explained as one possessing the piezoelectric vibrator 30, there may be made the cylinder shape package type piezoelectric vibrator 50 instead of the piezoelectric vibrator 30, or may be made the ceramic package type piezoelectric vibrator 60.

Figure 19:
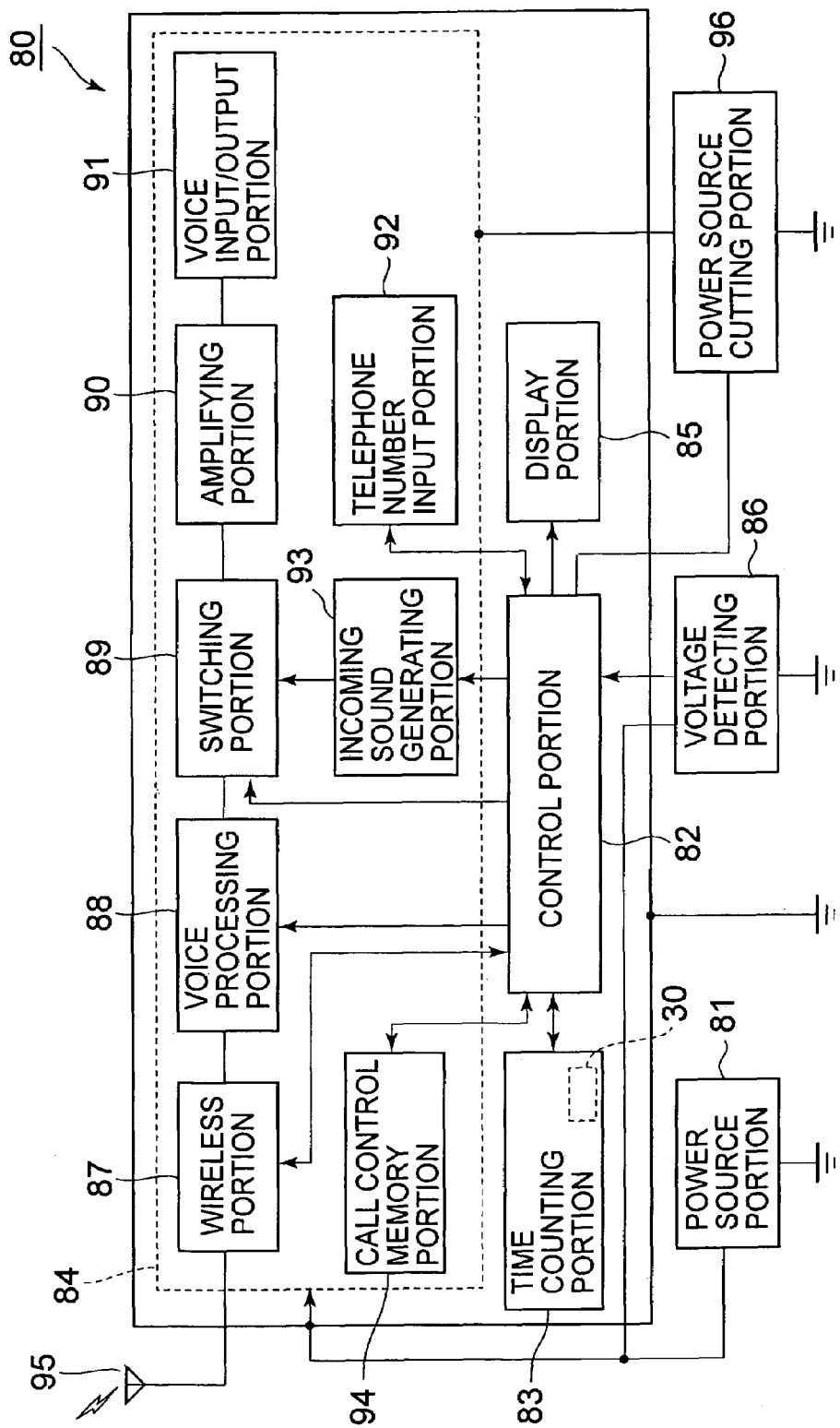
FIG. 19 is a constitutional diagram showing one embodiment of an electronic equipment having the piezoelectric vibrator concerned with the present invention.

Next, about one embodiment of an electronic equipment concerned with the present invention, there is explained by referring to FIG. 19. Incidentally, there is explained with a portable information equipment having the above-mentioned piezoelectric vibrator 30 being made an example as the electronic equipment. FIG. 19 is a diagram showing a constitution of the electronic equipment.

As shown in FIG. 19, a portable information equipment 80 of the present embodiment possesses the piezoelectric vibrator 30, a power source portion 81 for supplying an electric power. The power source portion 81 comprises a lithium battery for instance. To this power source portion 81, there are connected in parallel a control portion 82 performing various controls, a time counting portion 83 counting a time instant or the like, a communication section 84 performing a communication with an outside, a display portion 85 displaying various information, and a voltage detecting portion 86 detecting a voltage of each functional portion. And, there is adapted such that the electric power is supplied to each functional portion by the power source portion 81.

By controlling each functional portion, the control portion 82 performs operation controls of the whole system, such as a transmission and a reception of a voice data, and a measurement or a display of a present time instant. Further, the control portion 82 possesses a ROM in which a program has been previously written, a CPU reading and implementing the program having been written in the ROM, a RAM used as a work area of the CPU, and the like.

The time counting portion 83 possesses an integrated circuit building in an oscillation circuit, a register circuit, a counter circuit, an interface circuit and the like, and the piezoelectric vibrator 30. If the voltage is applied to the piezoelectric vibrator 30, the quartz crystal vibrating piece 1 vibrates, the vibration is converted into the electric signal by the piezoelectric characteristic that the quartz crystal has, and it is inputted to the oscillation circuit as the electric signal. An output of the oscillation circuit is binarized, and counted by the register circuit and the counter circuit. And, through the interface circuit there is performed a transmission/reception of a signal from/to the control portion 82, and in the display portion 85 there is displayed the present time instant, a present date, a calendar information or the like.

The communication section 84 has a function similar to the conventional portable telephone, and possesses a wireless portion 87, a voice processing portion 88, a switching portion 89, an amplifying portion 90, a voice inputting/outputting portion 91, a telephone number inputting portion 92, a incoming sound generating portion 93 and a call controlling memory portion 94.

The wireless portion 87 performs an exchange of the transmission/reception of various data such as voice data with a base station through an antenna 95. The voice processing portion 88 codes and decodes a voice signal having been inputted from the wireless portion 87 or the amplifying portion 90. The amplifying portion 90 amplifies a signal having been inputted from the voice processing portion 88 or the voice inputting/outputting portion 91 till a predetermined level. The voice inputting/outputting portion 91 comprises a speaker, a microphone and the like, and amplifies a ringtone and a received voice, or collects a voice.

Further, the incoming sound generating portion 93 forms the ringtone in compliance with a call from the base station. By the fact that the switching portion 89 switches, only at an incoming call time, the amplifying portion 90 connected to the voice processing portion 88 to the incoming sound generating portion 93, the ringtone having been formed in the incoming sound generating portion 93 is outputted to the voice inputting/outputting portion 91 through the amplifying portion 90.

Incidentally, the call controlling memory portion 94 stores a program concerning an arrival-and-departure call control of the communication. Further, the telephone number inputting portion 92 possesses, e.g., number keys of 0 to 9 and other keys and, by pressing down these number keys and the like, there are inputted the telephone number of a call destination, and the like.

In a case where the voltage applied by the power source portion 81 to each functional portion of the control portion 82 and the like has become below a predetermined value, the voltage detecting portion 86 detects that voltage drop and notifies it to the control portion 82. The predetermined voltage value at this time is a value previously set as a lowest voltage necessary for stably operating the communication section 84, and becomes about 3 V for instance. The control portion 82 having received the notification of the voltage drop from the voltage detecting portion 86 prohibits operations of the wireless portion 87, the voice processing portion 88, the switching portion 89, and the incoming sound generating portion 93. Especially, an operation stop of the wireless portion 87 whose electric power consumption is large becomes indispensable. Additionally, in the display part 85 there is displayed to the effect that the communication section 84 has become unusable due to a shortage of battery residual quantity.

That is, by the voltage detecting portion 86 and the control portion 82, the operation of the communication section 84 is prohibited, and in the display portion 85 there can be displayed to that effect. Although this display may be a letter message, as a more intuitive display, there may be adapted such that a X (cross) mark is added to a telephone icon having been displayed in an upper part of a display face of the display portion 85.

Incidentally, the piezoelectric vibrator 30 possesses a power source cutting portion 96 capable of selectively cutting the power source of a portion concerning a function of the communication section 84 and, by this power source cutting portion 96, the function of the communication section 84 is certainly stopped.

As mentioned above, according to the portable information equipment 80 of the present embodiment, since it possesses the piezoelectric vibrator 30 having the quartz crystal vibrating piece 1 which has been more miniaturized and whose efficiency has been more increased, also the portable information equipment 80 itself can be miniaturized and increased in its efficiency, and the reliability of the product can be improved. Further, in addition to this, it is possible to obtain a stable and highly accurate timepiece information for the long term.

In the above-mentioned portable information equipment 80, although there has been explained with the example having possessed the piezoelectric vibrator 30, instead of this there may be built in the above-mentioned ceramic package type piezoelectric vibrator 60. Further, there may be made the cylinder shape package type piezoelectric vibrator 50. Incidentally, in a case where the cylinder shape package type piezoelectric vibrator 50 is used, if there is selected the surface mount type which is previously resin-molded so as to cover a periphery of the cylindrical case 51, since it can be connected onto a print substrate by a reflow solder at the same time as other electronic component, it is convenient.

Figure 20:
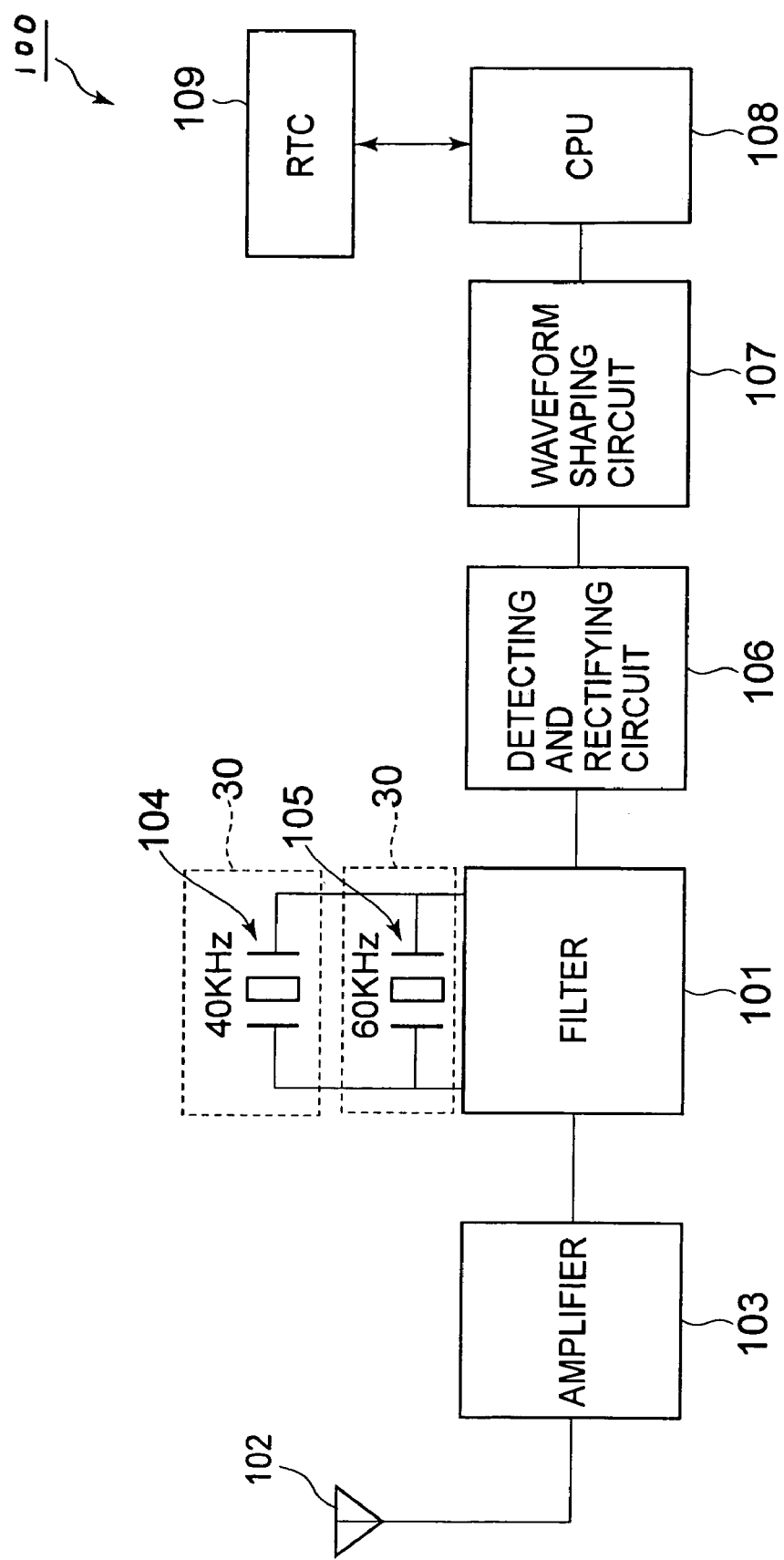
FIG. 20 is a constitutional diagram showing one embodiment of a radio-controlled timepiece having the piezoelectric vibrator concerned with the present invention.

Next, about one embodiment of a radio-controlled timepiece concerned with the present invention, there is explained by referring to FIG. 20. FIG. 20 is a diagram showing a constitution of the radio-controlled timepiece having the above-mentioned piezoelectric vibrator 30. However, not only the piezoelectric vibrator 30, there may be built in the ceramic package type piezoelectric vibrator 60 or the cylinder package type piezoelectric vibrator 50.

As shown in FIG. 20, a radio-controlled timepiece 100 of the present embodiment is one having possessed the piezoelectric vibrator 30 having been electrically connected to a filter section 101, and is a timepiece having possessed a function receiving a standard wave containing a timepiece information and automatically correcting the time instant to a correct time instant to thereby display it.

In Japan, transmitting stations transmitting the standard wave exist in Fukushima prefecture (40 kHz) and Saga prefecture (60 kHz), and they are respectively transmitting the standard wave. Since a long wave like 40 kHz or 60 kHz has in combination a nature propagating along an earth surface and a nature propagating while reflecting between an ionosphere and the earth surface, a propagation range is wide, and the inside of Japan is wholly covered by the above two transmitting stations.

By referring to FIG. 20, there is explained about a functional constitution of the radio-controlled timepiece 100.

An antenna 102 receives the long wave standard wave of 40 kHz or 60 kHz. The long wave standard wave is one in which a time instant information called a time code has been applied to a carrier wave of 40 kHz or 60 kHz by an AM modulation. The long wave standard wave having been received is amplified by an amplifier 103, and filtered and tuned by a filter section 101 having the plural piezoelectric vibrators 30.

The piezoelectric vibrators 30 in the present embodiment respectively possess quartz crystal vibrator parts 104, 105 having resonance frequencies of 40 kHz and 60 kHz, which are the same as the above carrier frequency.

Additionally, a signal of a predetermined frequency, which has been filtered, is detection-demodulated by a detection, rectification circuit 106. Subsequently, the time code is taken out through a waveform adjusting circuit 107, and it is counted by a CPU 108. In the CPU 108, there is read an information such as a year at present, an accumulated day, a day of the week, and a time instant. The information having been read is reflected to an RTC 109, and an accurate time instant information is displayed.

Since the carrier wave is 40 kHz or 60 kHz, it is suitable that the quartz crystal vibrator parts 104, 105 are vibrators having the above-mentioned tuning fork type structure. If 60 kHz is taken in an example, as a dimension example of the tuning fork type vibrating piece, it is possible to constitute by a dimension of about 2.8 mm in total length, and about 0.5 mm in width dimension of the base part.

As mentioned above, according to the radio-controlled timepiece 100 of the present embodiment, since it possesses the piezoelectric vibrator 30 having the quartz crystal vibrating piece 1 which has been more miniaturized and whose efficiency has been more increased, also the radio-controlled timepiece 100 itself can be miniaturized and increased in its efficiency, and the reliability of the product can be improved. Further, in addition to this, it is possible to count the time instant stably and highly accurately for the long term.

Incidentally, a technical scope of the present invention is not limited to the above embodiment, and various modifications can be added in a scope not deviating from a gist of the present invention.

For example, when manufacturing the quartz crystal vibrating piece 1, at the exposure process time, although the parallel light R has been slantingly irradiated by using the mask 24 having the two opening parts 23 to one vibrating arm part 2 (3) and disposing the mask 24 such that each opening part 23 is located respectively on the 1st edge E1 formed by the main face and the side face of the vibrating arm part 2 (3) and on the 2nd edge E2 formed by the main face of the vibrating arm part 2 (3) and the side face of the groove part 5, there is not limited to this case.

For example, there may be adapted such that the exposure is performed by using the mask 24 having one opening part 23 to one vibrating arm part 2 (3) and disposing the opening part 23 on either edge E1 (E2), and thereafter the exposure is performed again after the mask 24 has been shifted such that the opening part 23 is located on the other edge E2 (E1).

Like this, it suffices if the mask 24 is disposed such that the opening part 23 is located on at least either edge E1 (E2).

However, as having been explained in the above embodiment, by disposing the mask 24 such that the opening parts 23 are located on both edges E1, E2, since the exposures can be performed at the same time, it is possible to efficiently perform the manufacture in a short time, so that it is more desirable.

Further, at the exposure process time, the parallel light R has been slantingly irradiated along the face S intersecting perpendicularly to the longitudinal direction X of the one pair of vibrating arm parts 2, 3. However, on this occasion, the parallel light R may be irradiated under a state that a predetermined angle has been formed with respect to the face S intersecting perpendicularly to the longitudinal direction X by relatively changing a direction of the one pair of vibrating arm parts 2, 3 with respect to the parallel light R.

By doing like this, in addition to the exposure of the photoresist film 21 having been applied onto both main faces of the vibrating arm parts 2, 3 nipping the groove part 5, besides, it is possible at a suitable time to expose a region in which the exposure is necessary. For example, it is possible to expose the photoresist film 21 having been formed on a side face portion (a portion parallel to the face S intersecting perpendicularly to the longitudinal direction X: 4a shown in FIG. 4) of the base end side having been nipped by the one pair of vibrating arm parts 2, 3. By this, it is possible to form the 1st exciting electrode 6 and the 2nd exciting electrode 7 by more freely performing the division of the electrically conductive film 20. Therefore, it is possible to improve the degree of freedom in the design.

Further, in the above embodiment, the piezoelectric vibrator plate has been explained as the quartz crystal vibrator plate 31 consisting of the quartz crystal. However, it is not limited to this case, and may be a piezoelectric vibrator having a piezoelectric vibrator plate consisting of various piezoelectric single crystal materials such as niobic acid lithium for instance. Further, the base member 32 and the lid member 33 have been manufactured by the glass substrate such as soda-lime glass. However, they are not limited to the glass, and the material may be freely selected.

What is claimed is:

1. A method of manufacturing a piezoelectric vibrating piece having one pair of vibrating arm parts having been disposed parallel by using a photolithography technique to a piezoelectric plate consisting of a piezoelectric material, a base part integrally fixing base end sides of the one pair of vibrating arm parts, groove parts having been formed respectively in both main faces of the one pair of vibrating arm parts along a longitudinal direction of the vibrating arm part, and an exciting electrode which is formed on outer surfaces of the one pair of vibrating arm parts and which vibrates the one pair of vibrating arm parts, characterized in that an electrode formation process for forming the exciting electrode has:

a coating process for coating an electrically conductive film to whole outer surfaces of the one pair of vibrating arm parts, an application process for applying a photosensitive film consisting of positive type photosensitive material onto the electrically conductive film, an exposure process in which a mask having an opening part having been previously patterned is disposed such that the opening part is located on at least either edge of a 1st edge, in two places, formed by the main face and a side face of the vibrating arm part or a 2nd edge, in two places, formed by the main face and a side face of the groove part, and a parallel light is slantingly irradiated through the opening part toward at least either of a bottom face or an outside of the groove part while following a face intersecting perpendicularly to a longitudinal direction of the vibrating arm part to thereby expose the photosensitive film, a development process for developing the photosensitive film to thereby remove an exposed region, and an etching process for etching-working the electrically conductive film with the residual photosensitive film being made a mask, thereby forming the exciting electrode.

2. A method of manufacturing a piezoelectric vibrating piece according to claim 1, characterized in that, on an occasion of the exposure process, the mask is disposed such that the opening parts are located respectively on the 1st edge in one place and on the 2nd edge, in one place, which is in a positional relation nipping the groove part between it and the 1st edge, and the photosensitive film is exposed in two places at the same time through the opening parts.

3. A method of manufacturing a piezoelectric vibrating piece according to claim 1, characterized in that when the parallel light is irradiated toward a bottom face of the groove part in the exposure process, an incident angle of the parallel light and a position of the opening part are adjusted such that a plane region or a deepest part of the photosensitive film having been formed on the bottom face of the groove part is irradiated.

4. A method of manufacturing a piezoelectric vibrating piece according to claim 1, characterized in that, on an occasion of the exposure process, by relatively changing a direction of the one pair of vibrating arm parts with respect to an irradiation direction of the parallel light, the parallel light is irradiated under a state that a predetermined angle has been formed with respect to the face intersecting perpendicularly to the longitudinal direction.

* * * * *